US010658183B2

(12) United States Patent
Iguchi et al.

(10) Patent No.: US 10,658,183 B2
(45) Date of Patent: May 19, 2020

(54) IMPURITY ADDING APPARATUS, IMPURITY ADDING METHOD, AND SEMICONDUCTOR ELEMENT MANUFACTURING METHOD

(71) Applicant: FUJI ELECTRIC CO., LTD., Kawasaki (JP)

(72) Inventors: Kenichi Iguchi, Matsumoto (JP); Haruo Nakazawa, Matsumoto (JP); Masaaki Ogino, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 143 days.

(21) Appl. No.: 15/174,468

(22) Filed: Jun. 6, 2016

(65) Prior Publication Data
US 2016/0284547 A1 Sep. 29, 2016

Related U.S. Application Data

(63) Continuation-in-part of application No. PCT/JP2014/003147, filed on Jun. 12, 2014.

(51) Int. Cl.
*H01L 21/228* (2006.01)
*H01L 21/268* (2006.01)
(Continued)

(52) U.S. Cl.
CPC ........ *H01L 21/228* (2013.01); *H01L 21/0455* (2013.01); *H01L 21/268* (2013.01);
(Continued)

(58) Field of Classification Search
CPC ........ H01L 21/22–268; H01L 21/2225; B23K 26/144; B23K 26/146; C23C 10/20;
(Continued)

(56) References Cited

U.S. PATENT DOCUMENTS 4,509,852 A * 4/1985 Tabarelli ............. G03F 7/70241
355/30
4,511,595 A * 4/1985 Inoue ..................... B23K 26/08
118/641
(Continued)

FOREIGN PATENT DOCUMENTS

JP 1-259530 10/1989
JP 1-313930 12/1989
(Continued)

OTHER PUBLICATIONS

International Preliminary Report on Patentability dated Dec. 22, 2016 in corresponding International Patent Application No. PCT/JP2014/003147.
(Continued)

*Primary Examiner* — Mary A Wilczewski

(57) ABSTRACT

An impurity-doping apparatus is provided with: a supporting plate which supports a semiconductor substrate; a wall-like block disposed above the supporting plate floating away from the semiconductor substrate, the wall-like block implements a recess inside so as to establish a space for a solution region containing impurity elements, the solution region is localized on an upper surface of the semiconductor substrate, the upper surface being opposite to an bottom surface facing to the supporting plate; and a laser optical system, configured to irradiate a laser beam onto the upper surface of the semiconductor substrate, through the solution region surrounded by the wall-like block, wherein the impurity elements are doped into a part of the semiconductor substrate by irradiation of the laser beam.

13 Claims, 12 Drawing Sheets

(51) Int. Cl.
*H01L 21/67* (2006.01)
*H01L 29/16* (2006.01)
*H01L 21/04* (2006.01)
*H01L 21/22* (2006.01)

(52) U.S. Cl.
CPC .... *H01L 21/67017* (2013.01); *H01L 29/1608* (2013.01); *H01L 21/2225* (2013.01)

(58) Field of Classification Search
CPC ....... C23C 8/40; G03F 7/2041; G03F 7/2043; G03F 7/70341
See application file for complete search history.

(56) References Cited

U.S. PATENT DOCUMENTS

| | | | | | |
|---|---|---|---|---|---|
| 4,578,155 | A | * | 3/1986 | Halliwell | B29C 67/0062 205/86 |
| 4,578,157 | A | * | 3/1986 | Halliwell | C25D 5/024 205/86 |
| 4,659,587 | A | * | 4/1987 | Imura | H05K 3/185 427/554 |
| 4,681,774 | A | * | 7/1987 | Halliwell | H05K 3/185 427/306 |
| 4,766,009 | A | * | 8/1988 | Imura | C23F 1/02 216/37 |
| 4,873,413 | A | * | 10/1989 | Uesugi | H01L 21/268 219/121.68 |
| 5,059,449 | A | * | 10/1991 | van der Putten | C23C 18/14 257/E21.174 |
| 5,459,098 | A | * | 10/1995 | Maya | H01L 21/76894 257/E21.241 |
| 5,837,607 | A | * | 11/1998 | Quick | C23C 16/047 257/E21.054 |
| 5,849,043 | A | * | 12/1998 | Zhang | B60R 25/066 250/453.11 |
| 6,025,609 | A | * | 2/2000 | Quick | C23C 16/047 257/49 |
| 6,054,375 | A | * | 4/2000 | Quick | C23C 16/047 257/E21.054 |
| 7,528,929 | B2 | * | 5/2009 | Streefkerk | G03F 7/2041 355/30 |
| 7,951,632 | B1 | * | 5/2011 | Quick | G01J 5/08 257/E21.065 |
| 9,178,780 | B2 | * | 11/2015 | Rijsman | H04L 41/142 |
| 9,373,512 | B2 | * | 6/2016 | Breil | H01L 21/268 |
| 9,659,774 | B2 | * | 5/2017 | Nakazawa | H01L 21/268 |
| 9,716,008 | B2 | * | 7/2017 | Iguchi | H01L 29/1608 |
| 9,805,931 | B2 | * | 10/2017 | Sinclair | H01L 21/223 |
| 10,475,650 | B2 | * | 11/2019 | Ikenoue | B23K 26/066 |
| 2003/0148565 | A1 | * | 8/2003 | Yamanaka | H01L 21/2026 438/200 |
| 2005/0048220 | A1 | * | 3/2005 | Mertens | G03F 7/70341 427/553 |
| 2005/0175776 | A1 | * | 8/2005 | Streefkerk | G03F 7/2041 427/256 |
| 2005/0225734 | A1 | * | 10/2005 | De Smit | G03F 7/70341 355/30 |
| 2005/0259232 | A1 | * | 11/2005 | Streefkerk | G03F 7/70341 355/53 |
| 2005/0259234 | A1 | * | 11/2005 | Hirukawa | G03F 7/70341 355/53 |
| 2006/0023183 | A1 | * | 2/2006 | Novak | G03F 7/70341 355/53 |
| 2006/0023188 | A1 | * | 2/2006 | Hara | G03B 27/42 355/53 |
| 2006/0246694 | A1 | * | 11/2006 | Talwar | B23K 26/0604 438/487 |
| 2007/0242247 | A1 | * | 10/2007 | Shiraishi | G03B 27/42 355/53 |
| 2007/0243319 | A1 | * | 10/2007 | Carothers | B82Y 10/00 427/121 |
| 2007/0291241 | A1 | * | 12/2007 | Sakai | G03B 27/42 355/53 |
| 2008/0045041 | A1 | * | 2/2008 | Nakao | H01L 21/268 438/795 |
| 2008/0131817 | A1 | * | 6/2008 | Yoon | G03F 7/70341 430/319 |
| 2008/0171292 | A1 | * | 7/2008 | Hemker | G03F 7/70341 430/322 |
| 2008/0198347 | A1 | * | 8/2008 | Kawasaki | G03F 7/70341 355/30 |
| 2009/0073395 | A1 | * | 3/2009 | Berkvens | G03F 7/70341 355/30 |
| 2009/0185149 | A1 | * | 7/2009 | Sewell | G03F 7/70341 355/30 |
| 2009/0212020 | A1 | * | 8/2009 | Mayer | B24C 1/00 216/94 |
| 2009/0323035 | A1 | * | 12/2009 | Fujiwara | G03F 7/70066 355/53 |
| 2010/0144079 | A1 | * | 6/2010 | Mayer | C25D 5/024 438/57 |
| 2010/0197061 | A1 | * | 8/2010 | Huh | H01L 31/068 438/45 |
| 2010/0208221 | A1 | * | 8/2010 | Kramer | G03F 7/70341 355/30 |
| 2010/0213166 | A1 | | 8/2010 | Kray et al. | |
| 2010/0214544 | A1 | * | 8/2010 | Sewell | G03B 27/52 355/30 |
| 2010/0270635 | A1 | * | 10/2010 | Sickler | H01L 21/228 257/431 |
| 2010/0275990 | A1 | * | 11/2010 | Shimomura | H01L 31/022425 136/256 |
| 2011/0269263 | A1 | * | 11/2011 | Kang | H01L 21/228 438/98 |
| 2012/0282722 | A1 | * | 11/2012 | Wenham | H01L 31/022425 438/72 |
| 2016/0005606 | A1 | * | 1/2016 | Nakazawa | H01L 21/268 438/535 |
| 2016/0284547 | A1 | * | 9/2016 | Iguchi | H01L 21/228 |
| 2016/0314974 | A1 | * | 10/2016 | Iguchi | H01L 29/1608 |
| 2017/0062221 | A1 | * | 3/2017 | Sinclair | H01L 21/223 |
| 2018/0342397 | A1 | * | 11/2018 | Ikenoue | H01L 21/228 |

FOREIGN PATENT DOCUMENTS

| | | |
|---|---|---|
| JP | 8-259384 | 10/1996 |
| JP | 2005-79299 | 3/2005 |
| JP | 2009-524523 | 7/2009 |

OTHER PUBLICATIONS

Akihiro Ikeda et al., "Phosphorus doping of a 4H SiC by liquid immersion excimer laser irradiation", Applied Physics Letters, Feb. 4, 2013, 102, p. 052104-1-p. 052014-4.
Koji Nishi et al., "Phosphorus Doping into 4H SiC by Irradiation of Excimer Laser in Phosphoric Solution", Japanese Journal of Applied Physics, Jun. 20, 2016, vol. 52, No. 6, p. 06GF02-1-p. 06GF02-4.
International Search Report dated Oct. 14, 2014 in corresponding international Application No. PCT/JP2014/003147.
Japanese Office Action dated Oct. 4, 2016 in corresponding Japanese Patent Application No. 2016-527495.

* cited by examiner

IMPURITY ADDING APPARATUS, IMPURITY ADDING METHOD, AND SEMICONDUCTOR ELEMENT MANUFACTURING METHOD

CROSS REFERENCE TO RELATED APPLICATIONS AND INCORPORATION BY REFERENCE

This application is a continuation-in-part of International Application No. PCT/JP2014/003147 filed on Jun. 12, 2014, the entire contents of which are incorporated by reference herein.

BACKGROUND OF THE INVENTION

1. Field of the Invention

The present invention relates to an impurity-doping apparatus, an impurity-doping method, and a semiconductor device manufacturing method.

2. Description of the Related Art

Semiconductor devices using silicon carbide (SiC), especially 4H silicon carbide (4H—SiC), are being expected as power semiconductors. Semiconductor devices of 4H—SiC are typically produced by doping a semiconductor substrate, which includes a 4H—SiC crystalline layer grown epitaxially at a desired concentration, by ion-implantation of impurity elements such as phosphor (P) or aluminum (Al). Specifically, impurity-element ions are accelerated and irradiated onto a semiconductor substrate and implanted into the semiconductor substrate. Then, a process of annealing the semiconductor substrate is performed to recover the crystalline structure of the semiconductor substrate, damaged by the ion-implantation, and activate the impurity elements.

When high-dose amount, for example, about $10^{15}/cm^2$, of ions are implanted into a (0001) surface ((000-1) surface) of a 4H—SiC semiconductor substrate, it is necessary to heat the semiconductor substrate to about 300 to 800° C. in advance. If the heating is not performed in advance, recrystallization of 4H—SiC and activation of impurity elements are not effectively performed.

The annealing of SiC is performed at about 1600 to 1800° C., which is higher than that of Si. Such high-temperature annealing is known to cause Si atoms to fall off from SiC at the surface of the semiconductor device and roughen the surface of the semiconductor device due to migration. Accordingly, annealing is performed after protection film of aluminum nitride (AlN), carbon (C), or the like is deposed on the surface of the semiconductor device. However, formation of the protection film and its removal increase the number of processes and the processing cost. Moreover, there is a danger of contamination of the surroundings by aluminum (Al) or carbon (C).

As a method for solving such above problems, a technology of laser doping is proposed in non-patent literature (NPTL) 1 and NPTL 2. In NPTL 1 and NPTL 2, the doping method is as follows: a 4H—SiC semiconductor substrate is immersed in a solution as an aqueous solution containing impurity elements, and an interface region between the surface of the semiconductor substrate and the solution is irradiated with laser light. Accordingly, the semiconductor substrate is locally heated and doped by the impurity elements in the solution. The laser lights used in the method proposed by NPTL 1 and NPTL 2 are optical beams having a wavelength in the ultraviolet region, which cause a large absorption coefficient in SiC. According to the techniques of NPTL 1 and NPTL 2, implantation of the impurity elements and activation of the semiconductor substrate are simultaneously performed in an environment substantially at room temperature. Moreover, it is unnecessary to heat the semiconductor substrate in advance and anneal after the implantation of the impurity element.

However, in case of the technology in NPTL 1 and NPTL 2, the semiconductor substrate is needed to be entirely immersed in the solution. Accordingly, a problem arises that a large amount of the solution enough to immerse the semiconductor substrate entirely in the solution is needed for use.

CITATION LIST

NPTL 1: Ikeda Akihiro, et al., "Phosphorus doping of 4H SiC by liquid immersion excimer laser irradiation", Applied Physics Letters, Vol. 102, p 052104-1052104-4, January 2013;

NPTL 2: Nishi Koji, et al., "Phosphorus Doping into 4H—SiC by Irradiation of Excimer Laser in Phosphoric Solution", JAPANESE JOURNAL OF APPLIED PHYSICS, Vol. 52, No. 6, p 06GF02-1-4, June 2013.

SUMMARY OF THE INVENTION

The present invention was made in the light of the aforementioned problem, and an object of the invention is to provide an impurity-doping apparatus, an impurity-doping method, and a semiconductor device manufacturing method which an amount of the solution for use can be reduced at a laser doping while using impurity elements in the solution.

In order to solve the aforementioned problem, an aspect of the impurity-doping apparatus according to the present invention includes: a supporting plate which supports a semiconductor substrate; a wall-like block disposed above the supporting plate floating away from the semiconductor substrate, the wall-like block implements a recess inside so as to establish a space for a solution region containing impurity elements, the solution region is localized on a surface of the semiconductor substrate on the opposite side of the supporting plate, the wall-like block having a feeding canal and an ejecting canal, the feeding canal being used for injection of the solution and the ejecting canal being used for evacuation of the solution, the feeding and ejecting canals forming a flow path within the recess; and a laser optical system, configured to irradiate a laser beam onto the surface of the semiconductor substrate, through the solution region surrounded by the wall-like block, and configured to move along the flow path on the surface of the semiconductor substrate opposite to the supporting plate, wherein the impurity elements are doped into a part of the semiconductor substrate by irradiation of the laser beam.

Moreover, an aspect of the impurity-doping method according to the present invention includes the steps of: forming a solution region where solution containing impurity elements is localized, on a surface of a semiconductor substrate; moving the localized solution on the surface of the semiconductor substrate; and irradiating a laser beam to the surface of the semiconductor substrate through the solution region, wherein the impurity elements are doped into a part of the semiconductor substrate.

Moreover, an aspect of the semiconductor device manufacturing method according to the present invention includes the steps of: forming a solution region where solution containing impurity elements of a first conductivity type is localized is formed in a part of a surface of a semiconductor substrate of a first or second conductivity type; moving the localized solution on the surface of the semiconductor substrate; and irradiating a laser beam onto the semiconductor substrate through the solution region to form a first semiconductor region of the first conductivity type in the surface of the semiconductor substrate.

DETAILED DESCRIPTION OF THE INVENTION

Figure 1:
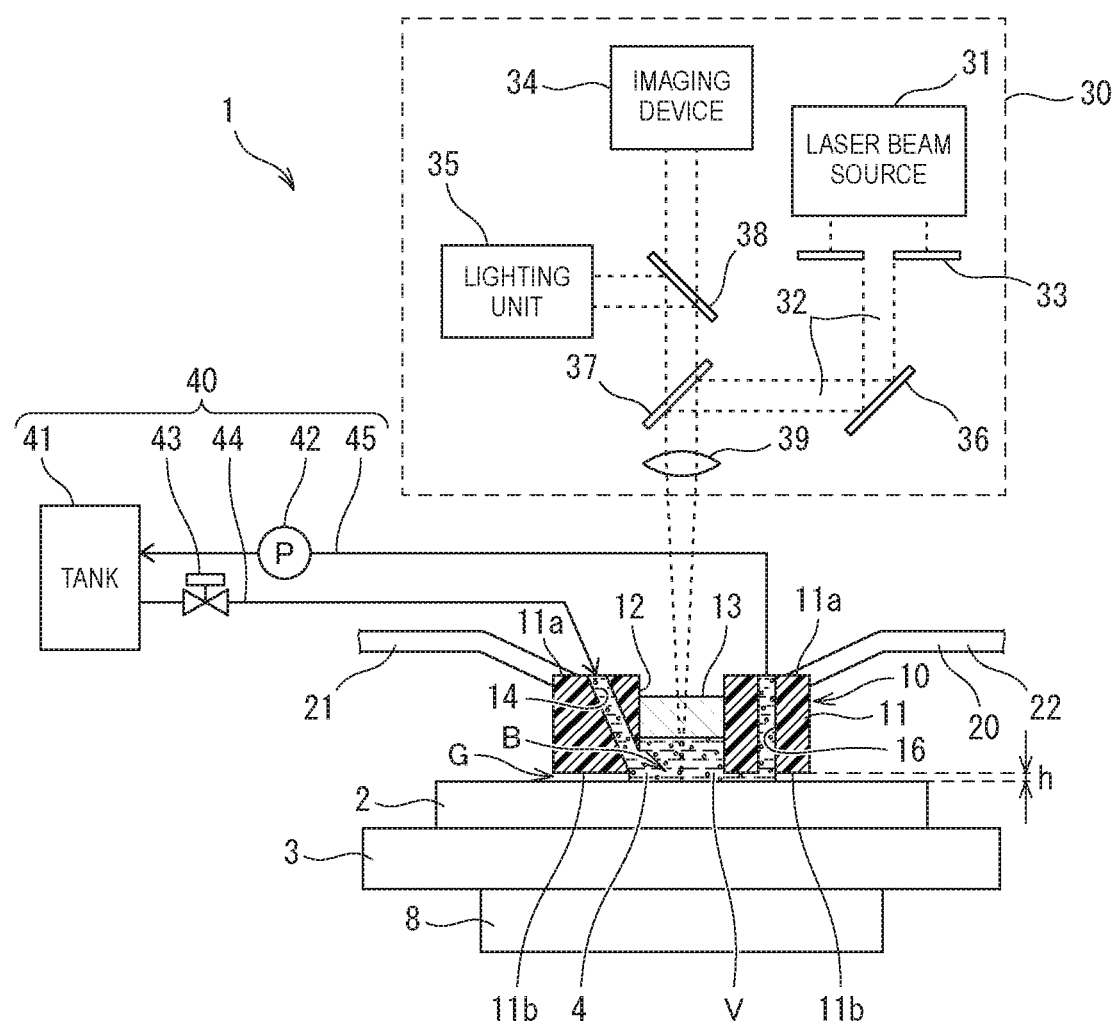
FIG. 1 is a partial cross-sectional side view for schematically explaining a structure of the impurity-doping apparatus according to the embodiment of the present invention.

Hereinafter, a description is given of an impurity-doping apparatus according to an embodiment of the present invention. In the illustrations, the shapes, sizes, and proportions of devices and members constituting the impurity-doping apparatus in the figures are properly simplified or exaggerated for explanation.

An impurity-doping apparatus 1 according to the embodiment of the present invention includes a supporting plate 3 which supports a semiconductor substrate 2, and a wall-like block 10 disposed above the supporting plate 3 floating away from the semiconductor substrate 2. The wall-like block 10 implements a recess 12 inside so as to establish a space for a localized solution region B. In the localized solution region B, solution 4 containing impurity elements is localized by the wall-like block 10 at the upper surface of the semiconductor substrate 2, illustrated as the upper surface in FIG. 1.

The impurity-doping apparatus 1 includes a supporting unit 20 and a laser optical system 30. The supporting unit 20 fixes and supports the wall-like block 10 above the supporting plate 3. The laser optical system 30 irradiates a laser beam 32 onto the upper surface of the semiconductor substrate 2 through the solution 4 surrounded by the wall-like block 10. The impurity-doping apparatus 1 further includes a circulation system 40 which supplies the solution 4 to the wall-like block 10 and circulates the solution 4 surrounded by the wall-like block 10 so that the solution 4 remains in contact with the upper surface of the semiconductor substrate 2. The impurity-doping apparatus 1 includes an X-Y moving stage 8 which freely moves the semiconductor substrate 2 in directions of X and Y axes. The X and Y axes are defined in a plane which is parallel to the upper surface of the semiconductor substrate 2.

The impurity-doping apparatus 1 dopes impurity elements into a part of the semiconductor substrate 2 by irradiation of the laser beam 32. In FIG. 1, the wall-like block 10 is illustrated in a combined cross-sectional view taken along a cross-sectional line I-I of FIG. 2.

In the following description, the semiconductor substrate 2 is supposed as is made of SiC. However, the material of the semiconductor substrate 2 is not limited to SiC. The semiconductor substrate 2 may be made of 4H—SiC, if use in power semiconductors is expected, for example. In the following description, the semiconductor substrate 2 is supposed to include a 4H—SiC crystalline layer formed by a method such as epitaxial growth, for example. Then, in the surface of the semiconductor substrate 2 irradiated with the laser beam 32, (0001) plane (or (000-1) plane) of 4H—SiC shall be assigned.

The solution 4 is a solution in which the impurity elements to be doped into the semiconductor substrate 2 are dissolved. In the impurity-doping apparatus 1 illustrated in FIG. 1, when the impurity elements are phosphor (P), the solution 4 can be phosphoric acid ($H_3PO_4$) solution of 85 weight %. The impurity elements are not limited to phosphor and may be properly another element such as boron (B), aluminum (Al), or nitrogen (N). The solution 4 is properly implemented by boric-acid solution when the impurity elements are boron, aluminum chloride solution when the impurity elements are aluminum, and ammonia solution when the impurity elements are nitrogen.

The supporting plate 3 is mounted on the X-Y moving stage 8. The X-Y moving stage 8 supports the supporting plate 3 horizontally from below. The X-Y moving stage 8 is connected to a not-illustrated driver and freely moves the semiconductor substrate 2 in X and Y directions in a horizontal plane. Coarse movements in the directions of the X and Y axes are driven by a stepping motor, for example, and submicron level movements are implemented by using magnetic levitation to eliminate friction. Moving the X-Y moving stage 8 by magnetic drive with no frictional force enables position control in nanometer level. The position control can be performed by feeding back the output from a laser interferometer, for example.

The X-Y moving stage 8 according to the embodiment of the present invention is preferably organized to be further driven in the direction of the Z axis, which is vertical to the directions of the X and Y axes, implementing a three-axis moving stage, which supports the semiconductor substrate 2 so that the semiconductor substrate 2 moves in the directions of the X, Y, and Z axes. Specifically, the impurity-doping apparatus 1 includes a stage driving unit, which is not illustrated, configured to move the X-Y moving stage 8 in the direction of the Z axis. By using the X-Y moving stage 8, which is capable of moving along the three axes, to freely move the semiconductor substrate 2 to a predetermined position in accordance with the irradiation target position of the laser beam 32, a desired pattern of the impurity-doped region can be directly delineated on the semiconductor substrate.

On an upper surface of the supporting plate 3 facing to the semiconductor substrate 2 side, which is illustrated as the upper side in FIG. 1, plural alignment marks, which is not illustrated, may be formed. The alignment marks can be used as irradiation target positions on the supporting plate 3 side, which may correspond to respective irradiation target positions defined in the semiconductor substrate 2, beforehand.

Figure 2:
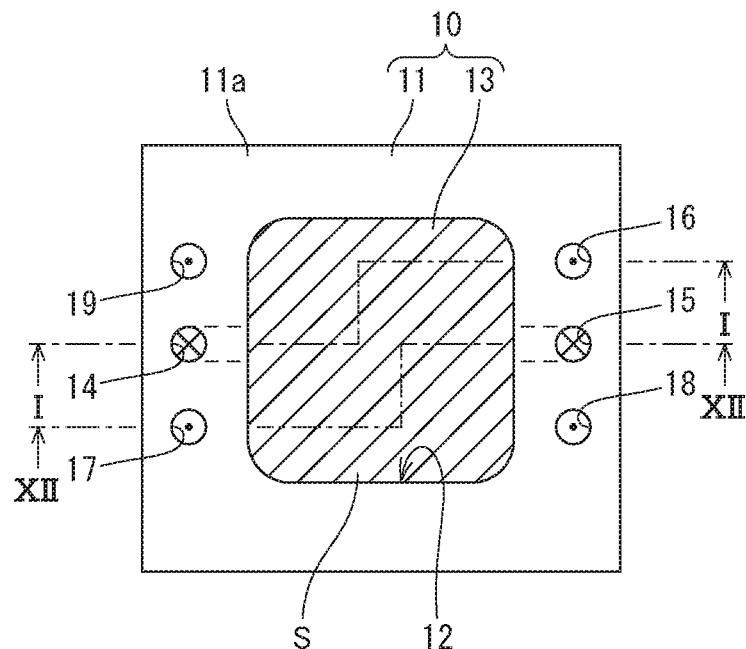
FIG. 2 is a top view for explaining a wall-like block included in the impurity-doping apparatus according to the embodiment of the present invention.

As illustrated in FIG. 2, the wall-like block 10 includes a rectangular-shaped body box 11 and a transmission window 13 bridging over the body box 11. The body box 11 implements a recess 12, which penetrates the body box 11 at the center in a top view. The transmission window 13 is horizontally laid in the body box 11 so as to cover the lower portion of the recess 12 penetrating in the body box 11 (see FIG. 1). If the body box 11 transmits a laser beam, the recess 12 does not required to be formed as penetrating the wall-like block 10, and the transmission window 13 is also unnecessary. Moreover, gap G is formed between the wall-like block 10 and the upper surface of the semiconductor substrate 2. The gap G is defined by a height h, which is so elected that the solution 4 injected into internal space V in the wall-like block 10 will not leak to the outside with surface tension. The wall-like block 10 surrounds the solution 4 above the semiconductor substrate 2 to form a layer of the solution 4 on the upper surface of the semiconductor substrate 2, so that the impurity elements are selectively in contact with the semiconductor substrate 2.

The body box 11 can be made of resin. The body box 11 has a substantially cuboidal appearance as a whole. The body box 11 has a square shape in a planar view with a side length of about 150 millimeter—each length is measured along the directions of the X and Y axes—and has a height of about 50 millimeter in the vertical direction—the length measured along the direction of the Z axis—in FIG. 1. The lengths of the body box 11 in the directions of the X and Y axes are shorter than the lengths of the semiconductor substrate 2 in the directions of the X and Y axes, respectively.

The recess 12 of the body box 11 penetrates in the vertical direction of FIG. 1. The wall-like block 10 is disposed above the semiconductor substrate 2 so that the axis of the recess 12 is parallel to the optical axis of the laser beam 32 and is not in contact with the semiconductor substrate 2. The laser beam 32 is irradiated onto the semiconductor substrate 2 through the recess 12 of the body box 11. As illustrated by a shaded region in FIG. 2, opening area S of the recess 12 of the body box 11 is an area defined at the front in a planar view, or the area defined in the horizontal cross-sectional view of the body box 11. The opening area S of the recess 12 is larger than the horizontal cross-sectional area of the laser beam 32 irradiating through the recess 12.

When the horizontal cross-section of the laser beam 32 optically penetrating the recess 12 is a rectangle with each side in the order of hundred micrometers, the horizontal cross-section of the body box 11 is a square with each side of one millimeter or more, for example. When each side of the horizontal cross-section of the laser beam 32 is increased to more than the order of hundred micrometers, the opening area S of the recess 12 is also increased in accordance with the increased horizontal cross-section of the laser beam 32.

In the body box 11, plural feeding canals 14 and 15 and plural ejecting canals 16 to 19 are formed as indicated by openings schematically illustrated in FIG. 2. The feeding canals 14 and 15 allow the solution 4 to be injected from the outside of the wall-like block 10 into the internal space V. The ejecting canals 16 to 19 allow the solution 4 to be discharged from the internal space V to the outside. The plural feeding canals 14 and 15 and the plural ejecting canals 16 to 19 are connected to the circulation system 40.

At the left side of the rectangle illustrated in FIG. 2, which correspond to one of two sides opposite to each other in the right-left direction, among four sides of the rectangle implemented by the upper surface 11a of the body box 11, the feeding canal 14 and two ejecting canals 17 and 19 are opened. The feeding canal 14 and two ejecting canals 17 and 19 in the one side of the rectangle of the body box 11 are opened in a straight line along the one side. The opening of the feeding canal 14 is sandwiched between the openings of the two ejecting canals 17 and 19, and is equidistant from the two ejecting canals 17 and 19.

At the right side of the rectangle illustrated in FIG. 2, which correspond to the other side of the rectangle implemented by the upper surface 11a, opposite to the one side across the recess 12 of the body box 11, the other feeding canal 15 and the two other ejecting canals 16 and 18 are opened in a similar manner to the one side of the rectangle. The feeding canal and ejecting canals on the one side of the rectangle of the body box 11 are symmetric to the feeding canal and ejecting canals of the body box 11 on the other side with respect to the recess 12 of the body box 11.

As illustrated in FIG. 1, through an aperture defined as one end of the feeding canal 14 on the one side of the rectangle, in the upper surface 11a of the body box 11, the solution 4 is poured in. The opposite aperture defined as another end of the feeding canal 14 on the one side of the rectangle, the opposite aperture is located at a corner of the body box 11, intersecting a lower surface 11b of the body box 11 and the wall surface of the recess 12 of the body box 11, the solution 4 is emitted. In other words, the feeding canal 14 is a conduct penetrating the body box 11 from the outside to the inside of the body box 11, and the conduct inclines from the top to the bottom of the body box 11. The feeding canal 15 on the other side of the rectangle is also an inclined conduct penetrating the body box 11 from the outside top to the inside bottom in a similar manner to the feeding canal 14 on the one side of the rectangle.

The feeding canal 14 of the body box 11 illustrated in FIG. 1 is a circular cylinder having a constant inner diameter from the inlet opening to the outlet opening of the solution 4, for example. A reservoir, which is not illustrated, may be formed in upper part in the body box 11. The reservoir has an area larger than the cross-sectional area of the feeding canal 14 and is opened to the processing chamber. The reservoir communicates with the feeding canal 14 so that the solution 4 is smoothly injected from the feeding canal 14 into the internal space V in the wall-like block 10 by using the atmospheric pressure in the chamber.

The two ejecting canals 16 and 18 on the other side of the rectangle are conducts each vertically penetrating the body box 11 between the upper and lower surfaces 11a and 11b of the body box 11 as illustrated in FIG. 1. The opening of the ejecting canal 16 on the other side of the rectangle in the lower surface 11b of the body box 11 is the inlet of the solution 4, and the opening of the ejecting canal 16 on the other side of the rectangle in the upper surface 11a of the body box 11 is the outlet of the solution 4. The two ejecting canals 17 and 19 on the one side of the rectangle are conducts each vertically penetrating the body box 11 between the upper and lower surfaces 11a and 11b of the body box 11 in a similar manner to the two ejecting canals 16 and 18 on the other side of the rectangle.

As illustrated in FIG. 1, the solution 4 is in contact with only the region surrounded by the wall-like block 10 at the upper surface of the semiconductor substrate 2. The localized solution region is defined only between the outlet opening of the feeding canal 14 on the one side of the rectangle of the body box 11 and the inlet opening of the ejecting canal 16 on the other side in the right-left direction in FIG. 1, on the upper surface of the semiconductor substrate 2.

Figure 3:
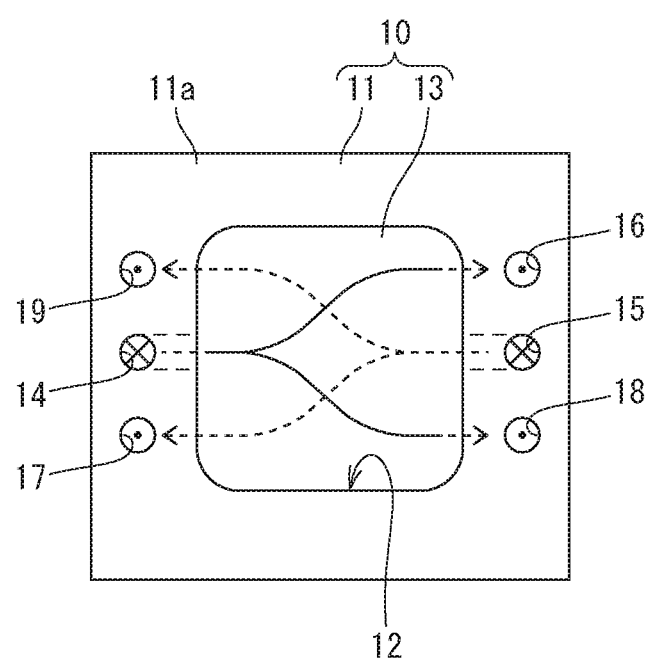
FIG. 3 is a top view for explaining flow paths of a solution in an internal space of the wall-like block included in the impurity-doping apparatus according to the embodiment of the present invention.

The solution 4 injected through the feeding canal 14 on the one side of the rectangle of the body box 11 is evacuated through the two ejecting canals 16 and 18 on the other side as illustrated by solid arrows in FIG. 3. In other words, the feeding canal 14 on the one side of the rectangle of the body box and the two ejecting canals 16 and 18 on the other side correspond to each other to form one flow path of the solution 4 in a certain direction, from left to right in FIG. 1.

The solution 4 injected through the feeding canal 15 on the other side of the rectangle of the body box 11 is belched out through the two ejecting canals 17 and 19 on the one side as illustrated by dashed arrows in FIG. 3. In other words, the feeding canal 15 on the other side of the rectangle of the body box 11 and the two ejecting canals 17 and 19 on the one side correspond to each other to form another flow path of the solution 4 in the direction opposite to the one flow path, from right to left in FIG. 1.

In two sides of the rectangle opposite to each other in the right-left direction across the recess 12 of the body box 11, two combinations of one feeding canal formed on one side and two ejecting canals formed in the other side corresponding to the feeding canal are provided symmetrically. The right-left direction of the rectangle is the moving direction of the supporting plate 3, in the direction of the X axis. The impurity doping apparatus 1 illustrated in FIG. 1 includes two combinations of the feeding canal and ejecting canals, so that the wall-like block 10 includes two paths in which the solution 4 flows in the respective directions opposite to each other. When the moving direction of the supporting plate 3 is reversed, accordingly, the flow direction of the solution 4 is changed by switching the two paths in the wall-like block 10 that the solution 4 flows in the respective directions opposite to each other.

An architecture in which the wall-like block 10 includes only one combination of feeding and ejecting canals, and the wall-like block 10 rotates 180 degrees to change the flow direction of the solution 4, can be employed. However, such architecture will complicates the structures of the wall-like block 10 and supporting unit 20 and increases the processing time of laser doping. Then, the impurity-doping apparatus 1 including two paths through which the solution 4 flows in the respective directions opposite to each other like the wall-like block 10 illustrated in FIG. 3 is preferred.

As illustrated in FIG. 1, the lower surface 11b of the body box 11 located above the upper surface of the semiconductor substrate 2 defines a plane of the wall-like block 10 facing to the upper surface of the semiconductor substrate 2 in parallel. The rectangular lower surface 11b of the body box 11 includes a water-repellent portion. The water-repellent portion prevents the solution 4 from leaking out of the wall-like block 10 through the gap G between the lower surface 11b of the body box 11 and the upper surface of the semiconductor substrate 2. The water-repellent portion is disposed at the outside of the openings of the plural ejecting canals 16 to 19 in the lower surface 11b of the body box 11, for example. The water-repellent portion may be established by the body box 11 itself of a water-repellent material, or by coating the water-repellent material to a predetermined region on the bottom surface of the body box 11.

The transmission window 13 is shaped so as to fit to and come into close contact with the recess 12 of the body box 11. The height, or the length measured along the vertical direction in FIG. 1, of the transmission window 13 is smaller than the height of the body box 11. In FIG. 1, the transmission window 13 is provided at a light collecting unit 39 side, or at the upper side, in the recess 12 of the body box 11, so that the upper portion of the recess 12 is shielded, and a minute internal space V is defined by the wall-like block 10 at the semiconductor substrate 2 side, which is illustrated as the lower side in FIG. 1, in the recess 12. The transmission window 13 implements "a window member" of the present invention.

The transmission window 13 is made of quarts and transmits the laser beam 32 from the laser optical system 30. The laser beam 32 is transmitted through the transmission window 13 and is then introduced into the internal space V defined by the wall-like block 10. When the solution 4 is injected into the internal space V in the wall-like block 10, the liquid surface of the solution 4 is in close contact with the lower surface, which is illustrated as the surface facing to the supporting plate 3 in FIG. 1, of the transmission window 13 to enhance stabilization of the liquid surface of the solution 4. The contact of the solution 4 to the transmission window 13 can reduce refraction and scattering of the laser beam 32 irradiated to the localized solution region.

The wall-like block 10 according to the embodiment of the present invention includes, the rectangular-shaped body box 11, which is a bottom-less rectangular cylinder, and the transmission window 13 shielding the upper portion of the cylinder inside. The wall-like block 10 is floating at height h slightly away from the upper surface of the semiconductor substrate 2 to define the gap G between the wall-like block 10 and semiconductor substrate 2.

The height h of the gap G measured from the upper surface of the semiconductor substrate 2 to the wall-like block 10 and is set to a value not more than the maximum length that can keep the solution 4 so as to achieve the internal space V in the wall-like block 10. To be specific, the height h is determined based on the viscosity of the solution 4 and pressure within the processing chamber for laser doping. When the solution 4 is phosphoric acid solution, for example, the relationship between the concentration of phosphor in the phosphoric acid solution and the viscosity of the phosphoric acid solution is obtained in advance by experiments or the like, and the value of the viscosity is obtained in accordance with the concentration of the phosphoric acid solution used in laser doping. Using the obtained value of the viscosity and the atmospheric pressure in the processing chamber, the height h is determined.

When the solution 4 is 85 wt % phosphoric acid solution according to the condition employed in the embodiment of the present invention, for example, the height h is preferably not more than 200 μm. Since the wall-like block 10 according to the embodiment of the present invention includes the gap G with the height h that can hold the solution 4 with surface tension, the wall-like block 10 and the upper surface of the semiconductor substrate 2 can establish the non-contact condition separated from each other, while the layer of the solution 4 is continuously formed in the internal space V.

As illustrated in FIG. 1, the laser optical system 30 according to the embodiment of the present invention includes a laser beam source 31, and a variable slit 33 which shapes the laser beam 32 emitted from the laser beam source 31 into a predetermined shape. The laser optical system 30 irradiates preferably laser beam having a wavelength that provides a larger energy than the band-gap energy of the semiconductor substrate 2. For example, the laser beam source 31 may emit laser beam in the ultraviolet range, such as a KrF (=248 nm) laser or ArF (=198 nm) laser. The energy absorbed by the semiconductor substrate 2 heats only the irradiated area to high temperature, facilitating movement of the impurity elements into lattice site locations in the crystal structure of 4H—SiC.

The laser optical system 30 includes a first mirror 36 and a second mirror 37 which reflect and guide the laser beam 32 shaped by the variable slit 33 to the light collecting unit 39. The laser optical system 30 further includes an imaging device 34 such as a CCD camera taking an image of an alignment mark on the supporting plate 3, an lighting unit 35 projecting illumination light, a third mirror 38 reflecting and transmitting the illumination light, and a not-illustrated alignment mechanism.

The second mirror 37 transmits illumination light from the lighting unit 35. The light collecting unit 39 is implemented by plural condenser lenses, for example. The alignment mechanism adjusts the position of the supporting plate 3 based on position information of the alignment marks of the supporting plate 3 shot and detected by the imaging device 34 for alignment so that the irradiation target region of the semiconductor substrate 2 is coincident with the optical axis of the light collecting unit 39.

The supporting unit 20 includes plural supporting arms 21 and 22 detachably coupled to the outer side surface of the wall-like block 10 as illustrated in FIG. 1. The supporting unit 20 is used to hold the relative height h between the lower surface of the wall-like block 10 and the upper surface of the semiconductor substrate 2. FIG. 1 illustrates two of the supporting arms 21 and 22 located at rear side of the wall-like block 10 in the front view of the drawing. The supporting unit 20 is connected to a wall-like block driving unit, which is not illustrated, and supports the wall-like block 10 so that the wall-like block 10 is movable in the optical axis direction, which is along the direction of the Z axis, as the vertical direction.

By combining the movement of the wall-like block 10 in the direction of the Z axis by the supporting unit 20 and the movement of the X-Y moving stage 8 in the direction of the Z axis, on which the supporting plate 3 is mounted and which is movable along the three axes, the height h between the lower surface 11b of the wall-like block 10 and the upper surface of the semiconductor substrate 2 is adjusted. In the other words, the supporting unit 20 controls movement of the wall-like block 10 while the X-Y movement stage 8 controls movement of the semiconductor substrate 2, so that the gap G with the height h adjusted is formed between the wall-like block 10 and semiconductor substrate 2.

The wall-like block 10 and supporting unit 20 implement a later-described wall-like block system 25 according to the embodiment of the present invention, and the wall-like block driving unit and stage driving unit implement a later-described driving system 9.

The circulation system 40 circulates the solution 4 between the tank 41 and wall-like block 10. As illustrated in FIG. 1, the circulation system 40 includes a tank 41 reserving the solution 4, an injection tube 44, and an evacuating tube 45. The injection and evacuating tubes 44 and 45 connect the tank 41 and wall-like block 10. The circulation system 40 includes a valve 43 provided for the injection tube 44 and a pump 42 provided for the evacuating tube 45. The injection tube 44 is connected to the feeding canal 14 of the wall-like block 10, and the evacuating tube 45 is connected to the ejecting canal 16 of the wall-like block 10.

Since the wall-like block 10 includes the plural feeding canals 14 and 15 and plural ejecting canals 16 to 19 (see FIG. 2), plural injection tubes, which is not illustrated, and plural evacuating tubes, which is not illustrated, are provided corresponding to the plural feeding canals 14 and 15 and plural ejecting canals 16 to 19. Valves and pumps are also provided corresponding to the plural injection tubes and plural evacuating tubes.

The injection tube 44 is a tube forming a forward path of the solution 4 from the tank 41 to the wall-like block 10 in the circulation system 40. The evacuating tube 45 is a tube forming a return path of the solution 4 from the wall-like block 10 to the tank 41. The injection and evacuating tubes 44 and 45 are implemented by flexible tubes made of a flexible material having a predetermined strength, for example. The pump 42 pumps the solution 4 from the tank 41 to the wall-like block 10. At the openings of the plural feeding canals 14 and 15 and the plural ejecting canals 16 to 19 in the upper surface 11a of the body box 11 of the wall-like block 10, joint members may be provided which tightly join the injection and evacuating tubes to the respective feeding and ejecting canals.

Figure 4:
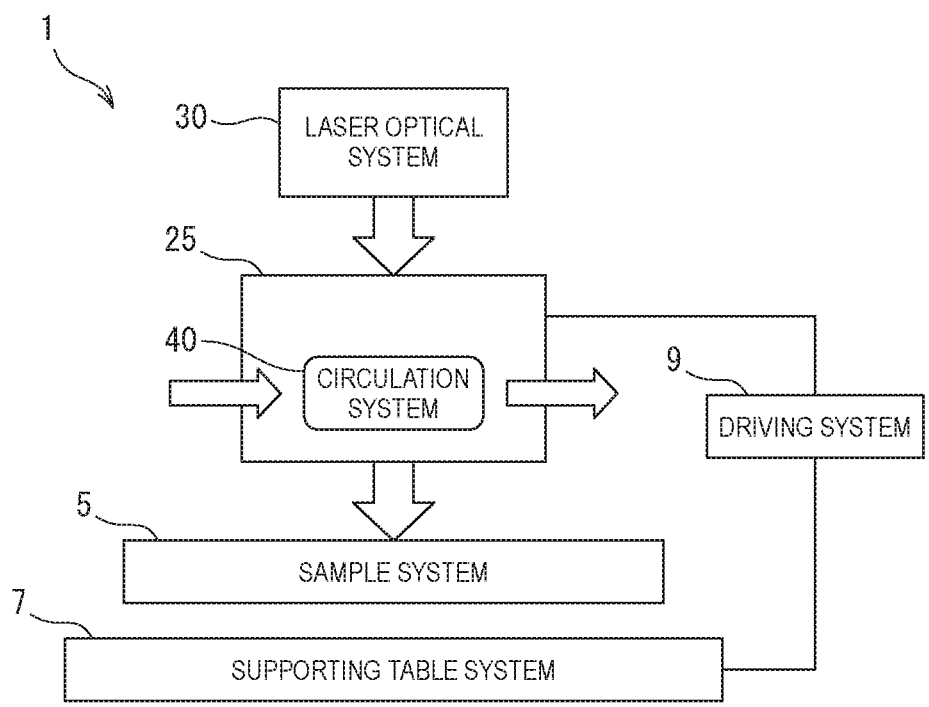
FIG. 4 is a schematic diagram for explaining plural systems included in the impurity-doping apparatus according to the embodiment of the present invention.

Next, a description is given of the configuration of the impurity-doping apparatus 1 according to the embodiment of the present invention in terms of six conceptual systems with reference to FIG. 4. The impurity-doping apparatus 1 illustrated in FIG. 4 includes: a sample system 5 which is an object to be irradiated with the laser beam 32, including the semiconductor substrate 2; and a supporting plate system 7 which fixes the sample system 5 and implements the supporting plate 3 movable in directions of the X, Y, and Z axes. The impurity-doping apparatus 1 includes: the laser optical system 30 which irradiates the laser beam 32 onto the sample system 5; and the wall-like block system 25 in which the wall-like block 10 is located between the laser optical system 30 and sample system 5 so as not to be in contact with the sample system 5.

The impurity-doping apparatus 1 illustrated in FIG. 4 further includes the circulation system 40, which supplies the solution 4 from the outside to the internal space V in the wall-like block 10 and circulates the solution 4 between the internal space V in the wall-like block 10 and the outside. The impurity-doping apparatus 1 includes a driving system 9, which moves the supporting plate system 7 and wall-like block system 25.

The laser optical system 30 according to the present invention only needs to irradiate laser beam capable of laser-doping the impurity element in the liquid phase into the semiconductor substrate 2 at least in the localized solution region on the upper surface of the semiconductor substrate 2. The driving system 9 preferably includes: the stage driving unit, which is not illustrated, moving the X-Y moving stage 8 in the direction of the Z axis, which is vertical to the X and Y axes; and a wall-like block driving unit, which is not illustrated, moving the wall-like block 10 of the wall-like block system 25 in the direction of the Z axis. The impurity-doping apparatus 1 may be configured to include only any one of the stage and wall-like block driving units as long as the impurity-doping apparatus 1 can control the height h between the lower surface 11b of the wall-like block 10 and the upper surface of the semiconductor substrate 2.

Next, a description is given of the operation of the impurity-doping apparatus 1 according to the embodiment of the present invention with reference to FIGS. 5 to 15. In each drawing, illustrations of some portions of the laser optical system 30, supporting unit 20, and circulation system 40 are properly omitted for explanation. The wall-like block 10 in each drawing and the semiconductor substrate 2 in some drawings are illustrated in cross-sectional views.

Figure 5:
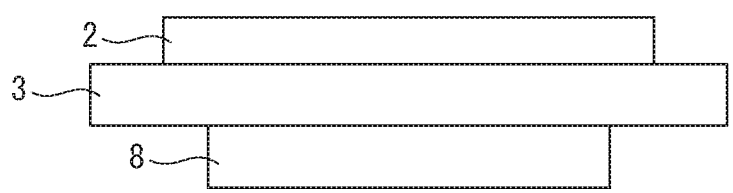
FIG. 5 is a side view for explaining an impurity-doping method according to the embodiment of the present invention.

As illustrated in FIG. 5, the semiconductor substrate 2 is placed and fixed on the supporting plate 3 with the surface the semiconductor substrate 2 facing the upper side in FIG. 5, opposite to the supporting plate 3. The inside of the chamber where the supporting plate 3 is disposed is set at atmospheric pressure.

Figure 6:
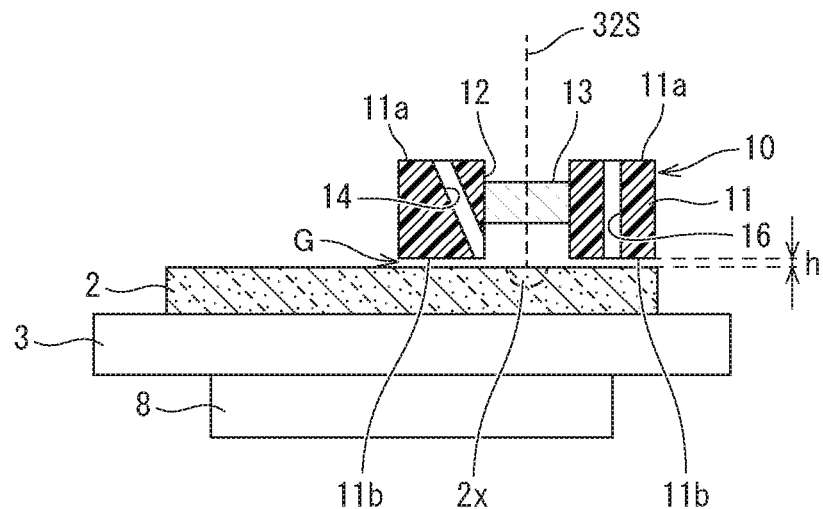
FIG. 6 is a partial cross-sectional view for explaining the impurity-doping method according to the embodiment of the present invention.

Next, the supporting plate 3 is moved by predetermined amounts in the directions of the X and Y axes so that the position of the alignment mark corresponding to an irradiation target region 2x in the semiconductor substrate 2 where the impurity elements are to be doped is coincident with an optical axis 32s of the light collecting unit 39. As illustrated in FIG. 6, the supporting plate 3 is moved to locate the irradiation target region 2x in the semiconductor substrate 2 just under the recess 12 of the wall-like block 10.

Using the supporting plate 3 or supporting unit 20, the semiconductor substrate 2 and wall-like block 10 are separated from each other to form the gap G with the height h between the semiconductor substrate 2 and wall-like block 10. In the formation of the gap G, the wall-like block 10 may be moved in the direction of the Z axis using only one of the supporting plate 3 and supporting unit 20 or may be moved in the direction of the Z axis using both of the supporting plate 3 and supporting unit 20.

Figure 7:
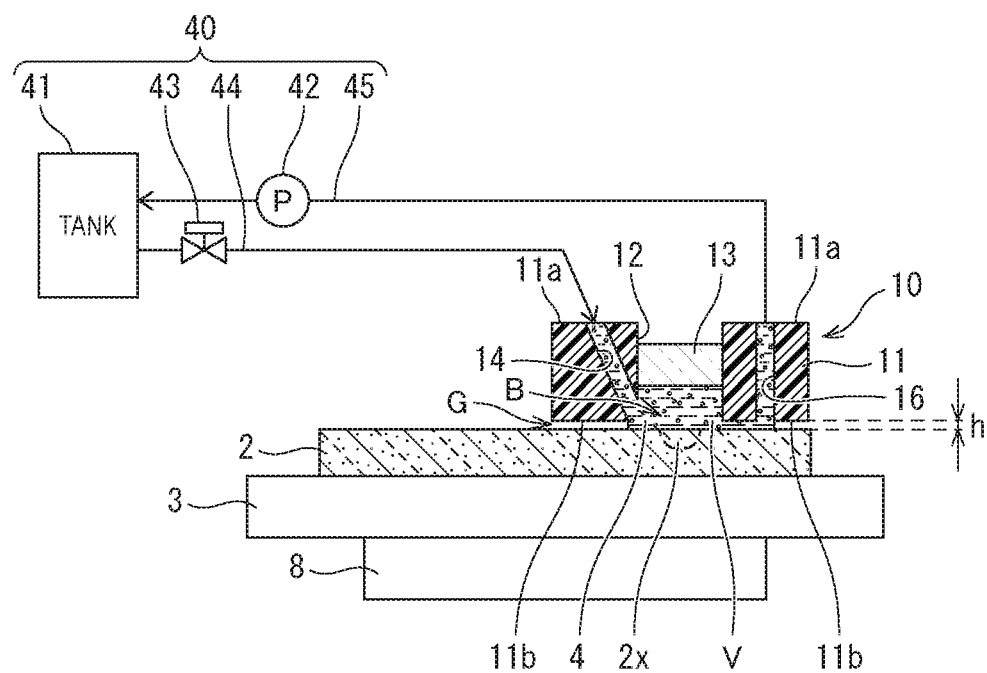
FIG. 7 is a partial cross-sectional view for explaining the impurity-doping method according to the embodiment of the present invention.

Next, as illustrated in FIG. 7, the pump 42 connected to the ejecting canal 16 on the other side, which is illustrated as the right side in FIG. 3, of the rectangle of the body box 11 is driven to force the solution 4 in the tank 41 to the feeding canal 14 on the one side of the rectangle. The ejecting canal 18 provided on the other side of the rectangle together with the ejecting canal 16 is also connected to a not-illustrated pump, which is driven at the same time as the pump 42 connected to the ejecting canal 16. The valve 43 connected to the feeding canal 14 on the one side of the rectangle of the body box 11 is opened while a valve, which is not illustrated, connected to the feeding canal 15 on the other side of the rectangle is closed.

Thus, the flow path from the one side of the rectangle of the body box 11 to the other side is formed in the internal space V in the wall-like block 10. The direction from the one side of the rectangle to the other side is set as the moving direction of the supporting plate 3 in subsequent laser doping. The solution 4 forced out of the tank 41 flows through the injection tube 44 to the feeding canal 14 of the wall-like block 10 and then reaches the internal space V through the feeding canal 44.

The solution 4 pumped to the internal space V in the wall-like block 10 is surrounded by the wall-like block 10 and fills the internal space V so that the liquid surface reaches the lower surface of the transmission window 13. The solution 4 thus forms a layer of the solution 4 on the upper surface of the semiconductor substrate 2 that faces the internal space V.

Figure 8:
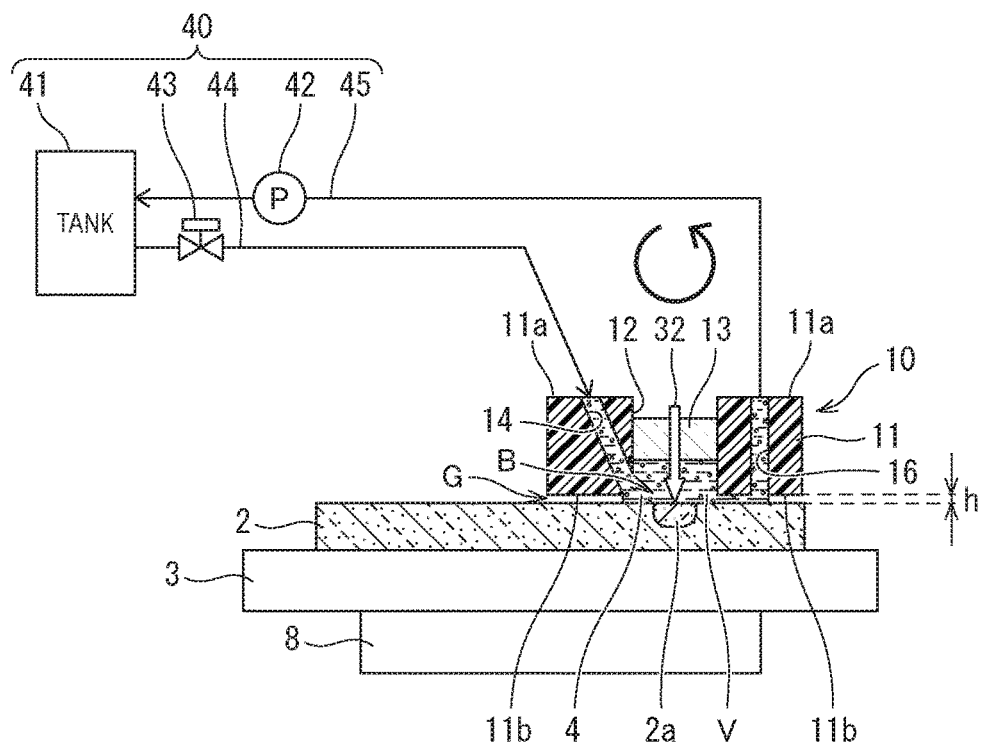
FIG. 8 is a partial cross-sectional view for explaining the impurity-doping method according to the embodiment of the present invention.

Next, the laser beam 32 is irradiated onto the localized solution region on the upper surface of the semiconductor substrate 2. When the laser beam 32 is irradiated onto the irradiation target region 2x on the upper surface of the semiconductor substrate 2, the irradiation target region 2x then becomes an irradiated region 2a with the impurity element doped as illustrated in FIG. 8.

The laser beam 32 may be irradiated plural times onto each irradiation target region on the semiconductor substrate 2. Irradiating the laser beam 32 plural times on the semiconductor substrate 2 increases the amount of the doped impurity element and increases the depth to which the impurity elements are diffused from the upper surface of the semiconductor substrate 2. However, as the number of irradiations increases, the processing time increases, and the surface of the semiconductor substrate 2 becomes rougher. The number of irradiations is desirably set to a moderate number to shorten the manufacturing time of semiconductor devices or reduce the roughness of the surface of the semiconductor substrate 2.

During the plural irradiations of the laser beam 32, the pumps connected to the two ejecting canals 16 and 18 on the other side of the body box 11 continues to be driven. Thus, the solution 4 is properly forced out of the tank 41 toward the wall-like block 10. The subsequent portion of the solution 4 is continuously supplied to the internal space V in the wall-like block 10 through the injection tube 44 while the portion of the solution 4 existing in the internal space V in the wall-like block 10 is forced by the subsequent portion of the solution 4 to flow through the two ejecting canals 16 and 18 and is continuously discharged to the outside of the wall-like block 10. The discharged solution 4 flows through the evacuating tube 45, back to the tank 41 again. In the wall-like block illustrated in FIG. 8, the solution 4 is circulated between the internal space V in the wall-like block 10 and the outside as indicated by a counterclockwise arrow in FIG. 8.

Figure 9:
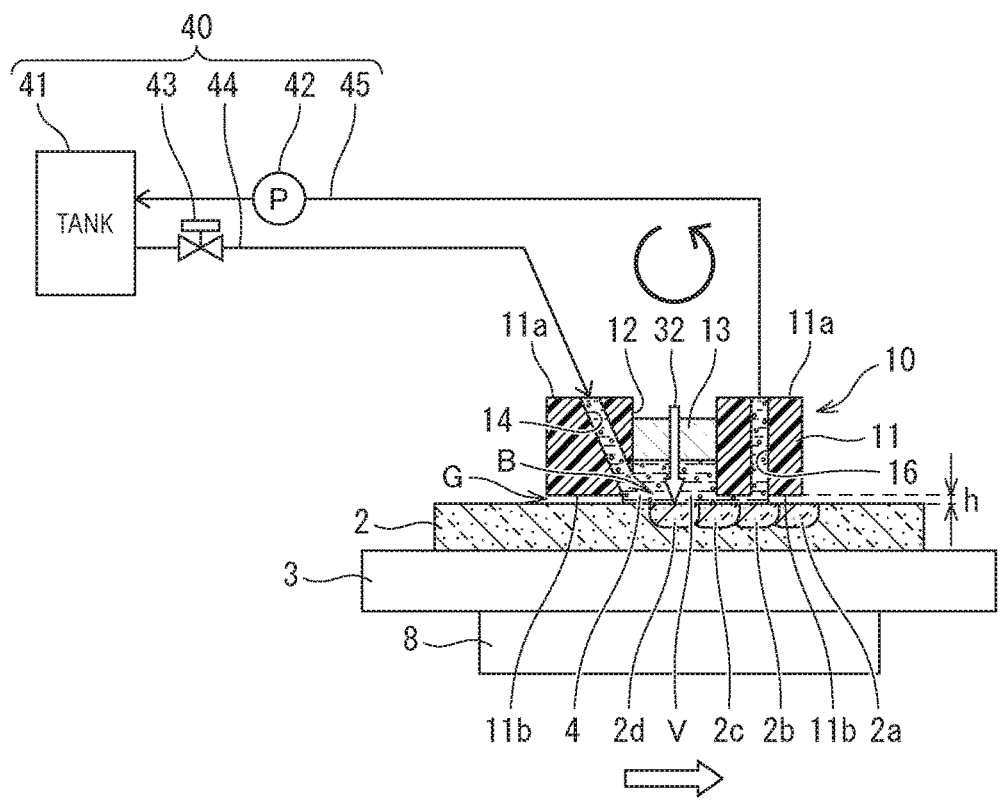
FIG. 9 is a partial cross-sectional view for explaining the impurity-doping method according to the embodiment of the present invention.

After a predetermined number of irradiations of the laser beam 32 to a irradiation target region, the supporting plate 3 is moved in one direction of the X axis as indicated by a rightward pointing arrow in FIG. 9. With the movement of the supporting plate 3, the irradiation target region on the semiconductor substrate 2 relatively moves in the other direction, from right to left in FIG. 9, along the X axis. The laser beam 32 is then irradiated to the irradiation target region next to the irradiated region 2a with the impurity element doped, thus successively forming irradiated regions 2b, 2c, 2d . . . where the impurity elements are doped, in the upper surface of the semiconductor substrate 2.

During the movement of the supporting plate 3 in the one direction of the X axis, the solution 4 circulates between the internal space V in the wall-like block 10 and the outside. The portion of the solution 4 used in laser doping at the prior irradiation target position is forced out of the wall-like block 10 by new portion of the solution 4 supplied to the internal space V in the wall-like block 10. At the subsequent irradiation target position, newly supplied portion of the solution 4 forms a solution layer. In the localized solution region B on the upper surface of the semiconductor substrate 2, old portion of the solution 4 is removed, and a layer of new portion of the solution 4 having a concentration necessary for laser doping is formed continuously.

As the irradiation target region on the semiconductor substrate 2 relatively moves toward the feeding canal 14 provided on the one side of the rectangle of the body box 11, the old portion of the solution 4 used in the prior laser doping moves toward the two ejecting canals 16 and 18 on the other side of the rectangle. In addition to circulation of the solution 4, old portion of the solution 4 moves with the moving supporting plate 3. The solution can accordingly circulate more smoothly.

The plural irradiated regions 2a, 2b, 2c, 2d, . . . , which are formed successively, implements an irradiated line as a region extending in the direction of the X axis. The amount by which the supporting plate 3 moves in the direction of the X axis may be properly configured in accordance with the progress of the irradiation process with the laser beam 32. In other words, the irradiated line may be formed either continuously or discontinuously. The irradiated line may be formed in such a manner that the plural irradiated regions overlap the irradiated regions adjacent by about a half the movement of the supporting plate 3 as illustrated in FIG. 10.

Figure 10:
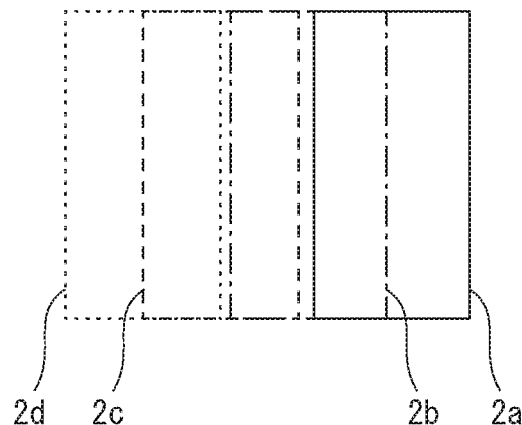
FIG. 10 is a top view for explaining the impurity-doping method according to the embodiment of the present invention.

In the case of the irradiated line of FIG. 10, the irradiated region 2b surrounded by a dashed-dotted line is formed to the left of the irradiated region 2a surrounded by a solid line. To the left of the irradiated region 2b surrounded by the dashed-dotted line, the irradiated region 2c surrounded by a dashed line is formed. To the left of the irradiated region 2c indicated by the dashed line, the irradiated region 2d indicated by a dotted line is formed.

Figure 11:
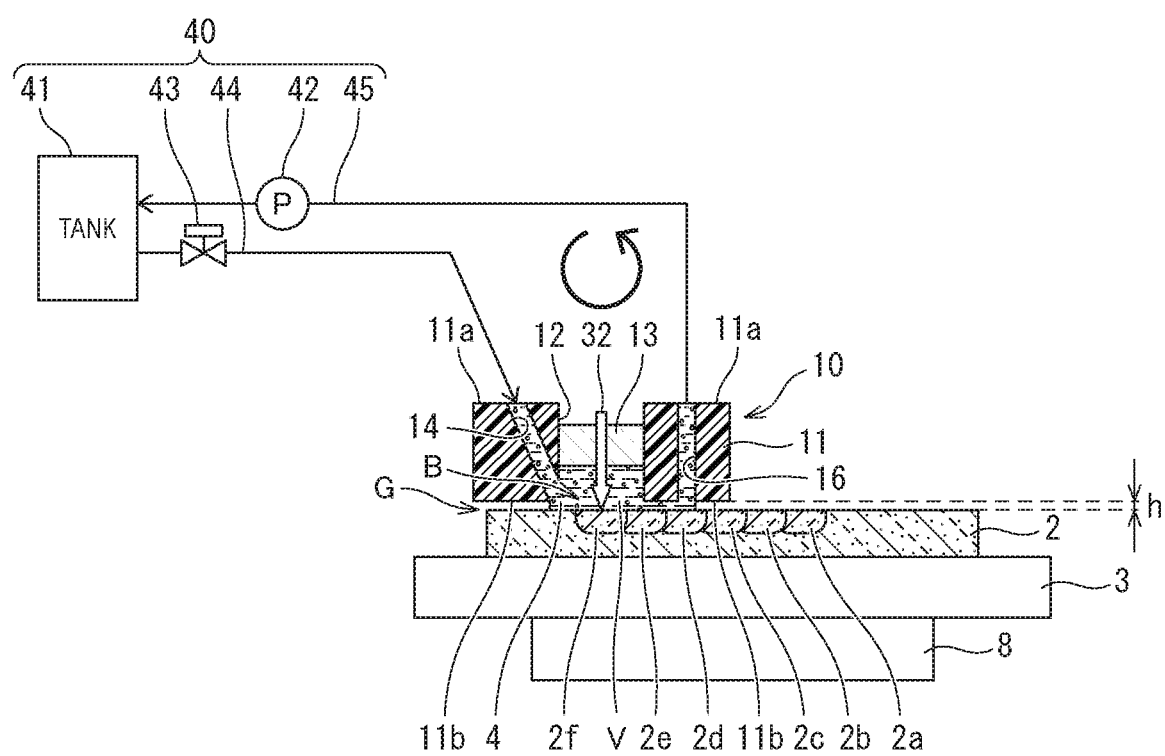
FIG. 11 is a partial cross-sectional view for explaining the impurity-doping method according to the embodiment of the present invention.

The irradiated regions are repeatedly performed as illustrated in FIGS. 6 to 10 until the irradiated region 2f at the end of a certain irradiated line in the direction of the X axis as illustrated in FIG. 11. Then, the flow direction of the solution 4 is reversed, and the supporting plate 3 is moved by a certain amount in the Y direction. The change of the flow direction of the solution 4 and movement of the supporting plate 3 in the direction of the Y axis may be performed in any order or simultaneously. Hereinafter, the change of the flow direction of the solution 4 and movement of the supporting plate 3 in the direction of the Y axis are separately described with reference to FIGS. 12 and 13. The wall-like block 10 in FIG. 12 is illustrated in a combination cross-sectional view along a line XII-XII in FIG. 2.

To be specific, the flow direction of the solution 4 is changed as follows. First, the valve 43 (see FIG. 11), which is provided for the injection tube 44 connected to the feeding canal 14 on the one side of the rectangle of the body box 11, is closed. Next, the two pumps (see FIG. 11) connected to the two ejecting canals 16 and 18 on the other side of the rectangle of the body box 11 are driven to collect the solution 4 from the internal space V in the wall-like block 10 to the tank 41. FIG. 11 illustrates only the pump 42, which is connected to the ejecting canal 16 on the other side of the rectangle of the body box 11.

Figure 12:
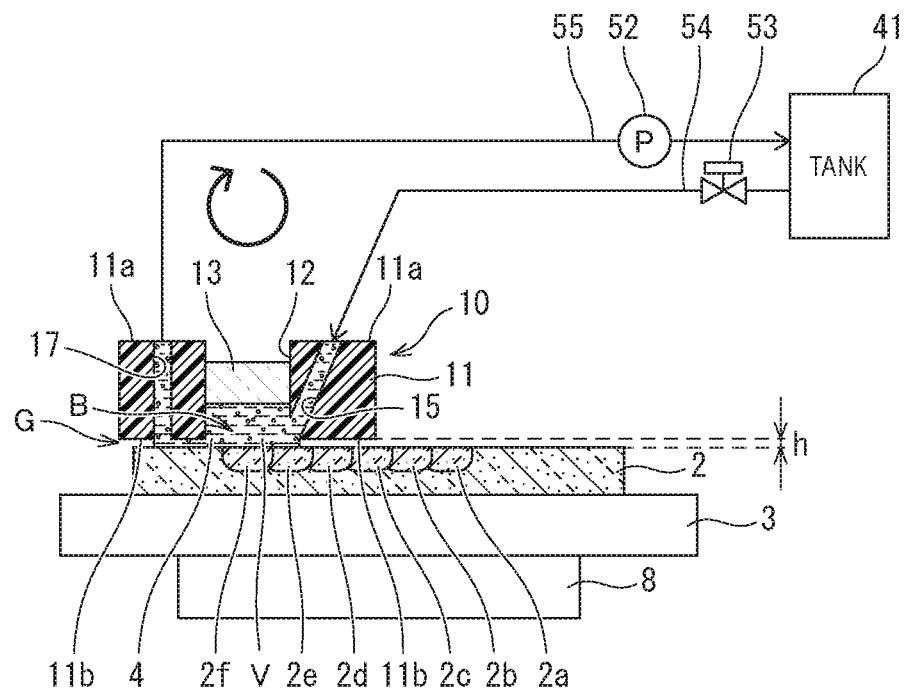
FIG. 12 is a partial cross-sectional view for explaining the impurity-doping method according to the embodiment of the present invention.

After the solution 4 of the internal space V in the wall-like block 10 is collected, as illustrated in FIG. 12, the valve 53 provided for the injection pipe 54, which is connected to the feeding canal 15 on the one side of the rectangle of the body box 11, is opened. The two pumps connected to the injection tube 55, which is connected to the ejecting canal 17 on the one side of the rectangle of the body box 11, are driven. FIG. 12 illustrates only the pump 52, which is connected to the ejecting canal 17 on the one side of the rectangle of the body box 11.

By driving the pump 52, the solution 4 flows from the feeding canal 15 on the other side of the rectangle of the body box 11 to the two ejecting canals 17 and 19 on the one side, which is illustrated as the flow direction indicated by dashed arrows in FIG. 3. The solution 4 is thus circulated between the internal space V in the wall-like block 10 and the outside as indicated by a clockwise arrow in FIG. 12. In the case of the wall-like block 10 illustrated in FIG. 12, another flow path is formed in the direction opposite to the one flow path of the solution 4 in the internal space V in the wall-like block 10 illustrated in FIG. 11.

Figure 13:
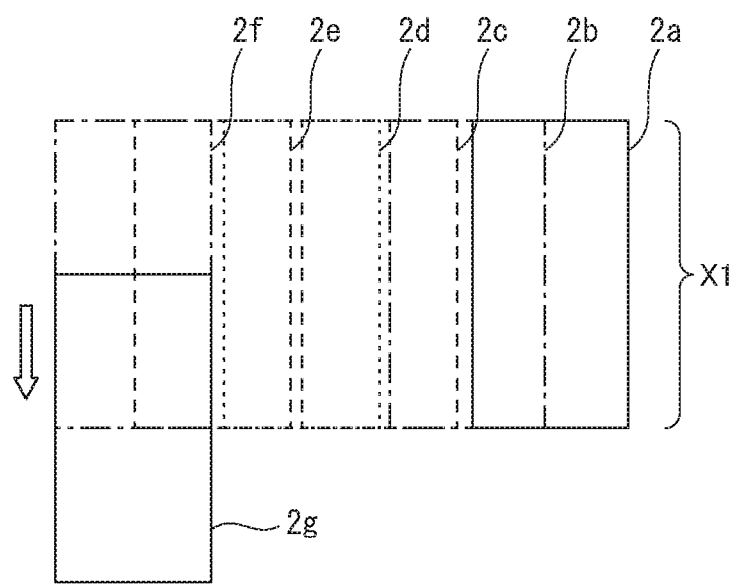
FIG. 13 is a top view for explaining the impurity-doping method according to the embodiment of the present invention.

The amount by which the supporting plate 3 moves in the direction of the Y axis may be properly configured in accordance with the progress of the irradiation process with the laser beam 32 in a similar manner to the movement in the direction of the X axis. In the movement illustrated in FIG. 13, the supporting plate 3 moves upward in FIG. 13. The trajectory of the irradiated regions shifts from right-left to left-right after a shift of position from the last irradiated region 2f of the prior irradiated line X1 to a first irradiated region 2g of the subsequent irradiated line, as indicated by a downward pointing arrow in FIG. 13. In FIG. 13, the last irradiated region 2f of the prior irradiated line X1 is surrounded by a dashed-dotted line, and the first irradiated region 2g of the subsequent irradiated line is surrounded by a solid line. The last irradiated region 2f of the prior irradiated line X1 overlaps the first irradiated region 2g of the subsequent irradiated line by about half the amount of each movement of the supporting plate 3.

Figure 14:
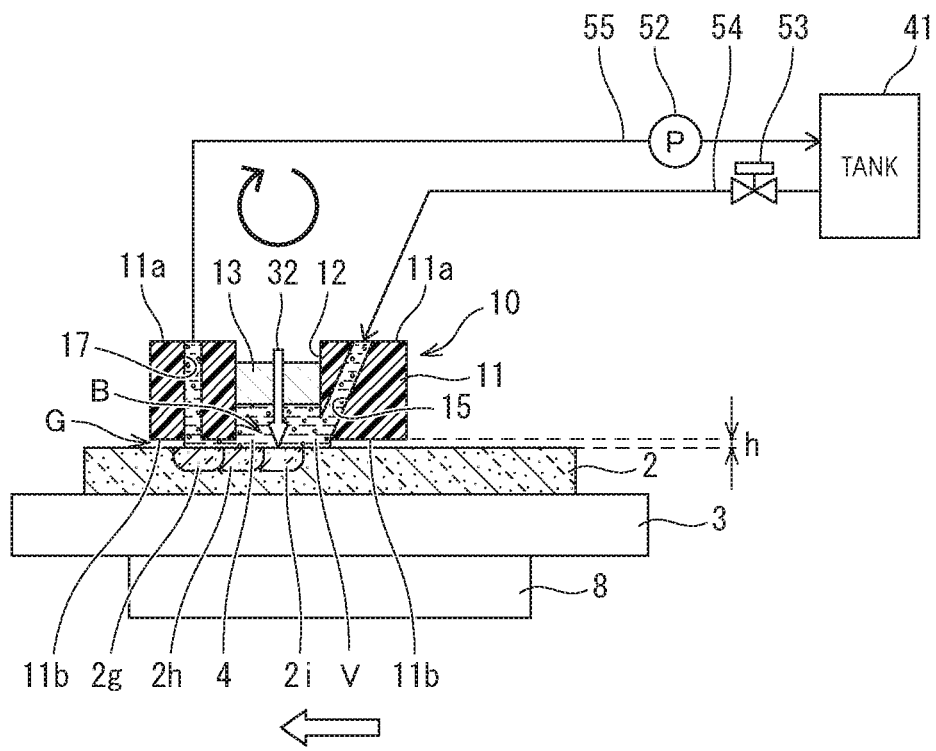
FIG. 14 is a partial cross-sectional view for explaining the impurity-doping method according to the embodiment of the present invention.

After completion of the change of the flow direction of the solution 4 and the movement of the supporting plate 3 in the Y direction, the supporting plate 3 is moved in the X direction in parallel to the prior irradiated line X1 as indicated by a leftward pointing arrow in FIG. 14. The solution 4 is circulated as indicated by a clockwise arrow in FIG. 14 while the solution 4 flows from the feeding canal 15 on the other side of the rectangle of the body box 11 to the two ejecting canals 17 and 19 on the one side in the internal space V in the wall-like block 10. Movement of the supporting plate 3 and irradiation of the laser beam 32 are repeatedly performed as illustrated in FIGS. 6 to 14, thus forming the subsequent irradiated line X2 as illustrated in FIG. 15.

Figure 15:
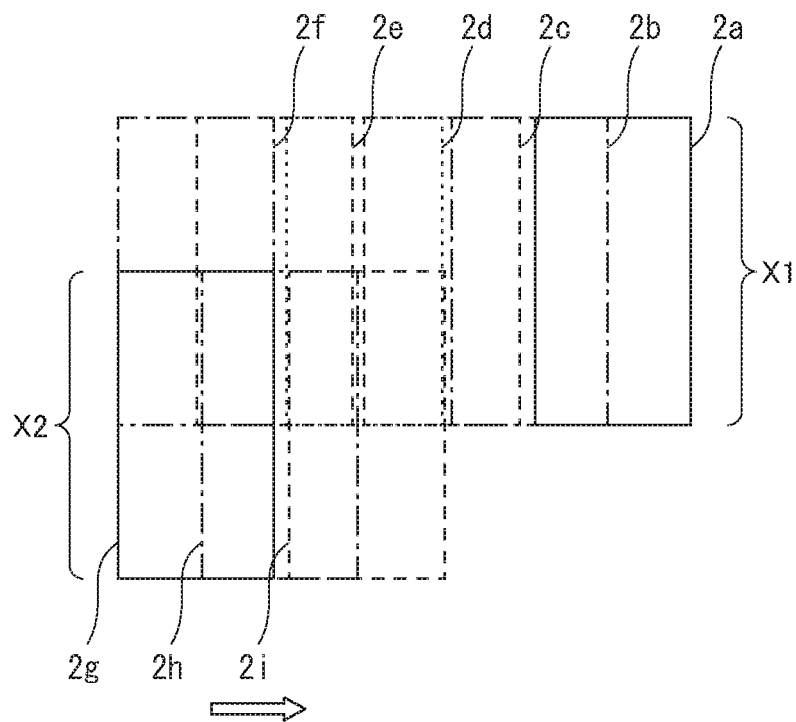
FIG. 15 is a top view for explaining the impurity-doping method according to the embodiment of the present invention.

In the case of the irradiated line X2 of FIG. 15, the irradiated regions are formed as indicated by a rightward pointing arrow in FIG. 15. To the right of the irradiated region 2g surrounded by a solid line in FIG. 15, an irradiated region 2h surrounded by a dashed-dotted line is formed. To the right of the irradiated region 2h surrounded by the dashed-dotted line, an irradiated region 2i surrounded by a dashed line is formed. The irradiated line X2 overlaps the prior irradiated line X1.

As illustrated in FIGS. 5 to 15, a impurity-doping method according to the embodiment of the present invention includes:

(i) a step of forming on the upper surface of the semiconductor substrate 2, a region where the solution 4 containing the impurity elements are localized;

(ii) a step of irradiating the laser beam 32 onto the upper surface of the semiconductor substrate 2 through the solution 4; and (iii) a step of moving the semiconductor substrate 2 in directions of the X and Y axes, which are defined in a plane parallel to the upper surface of the semiconductor substrate 2.

The steps (i) to (iii) are properly repeated to directly draw a pattern with the impurity element added within a part of the semiconductor substrate 2. The impurity element-doped surface is thus formed.

A description is given of a method of manufacturing a semiconductor device using the impurity-doping method according to the embodiment of the present invention. To be specific, at first, in upper part of the semiconductor substrate 2 of a first (p-type or n-type) or second (n-type or p-type) conductivity type, a semiconductor region (a second semiconductor region of the present invention) of the first conductivity type (p-type or n-type) is formed so that the upper surface of the semiconductor substrate 2 is exposed. Next, a region where the solution 4 containing the impurity element of the first conductivity type (p-type or n-type) is localized is formed within the second semiconductor region on the upper surface of the semiconductor substrate 2 in a planar pattern.

Next, the laser beam 32 is irradiated onto the second semiconductor region through the solution 4 to form in upper part of the second semiconductor region, a semiconductor region as "a first semiconductor region" of the present invention, of the first conductivity type (p- or n-type) with a concentration higher than that of the second semiconductor region. Next, an ohmic electrode region is formed in the first semiconductor region, thus manufacturing the semiconductor device.

Figure 16:
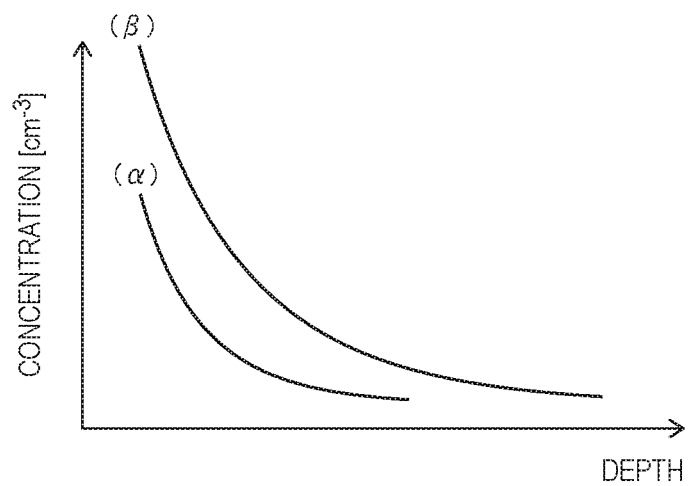
FIG. 16 is a characteristic diagram for explaining relation between a concentration and a depth of impurity elements doped in a semiconductor device, obtained through a semiconductor device manufacturing method to the embodiment of the present invention.
Figure 17:
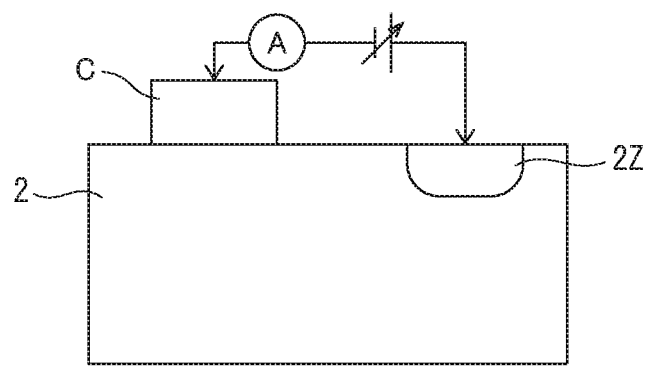
FIG. 17 is a schematic diagram for illustrating a circuit to experiment an electric character of the semiconductor device obtained through the semiconductor device manufacturing method to the embodiment of the present invention.
Figure 18:
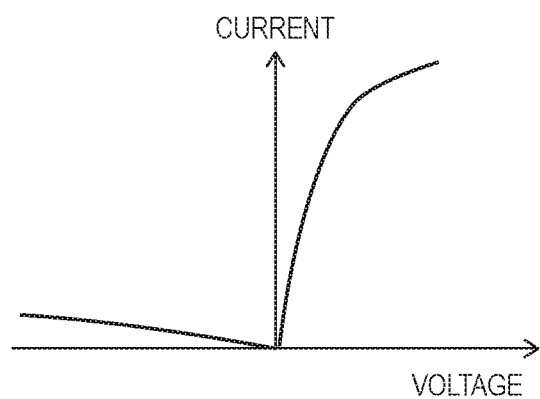
FIG. 18 is a voltage-current characteristics diagram obtained through the circuit in FIG. 17.

A description is given of the characteristics of the semiconductor device manufactured by the method of manufacturing a semiconductor device according to the embodiment of the present invention with reference to FIGS. 16 to 18. In the manufactured semiconductor device, as illustrated in FIG. 16, the concentration of the doped impurity element decreases with depth from the upper surface of the semiconductor substrate 2. This explains that the impurity elements are introduced and diffused from the upper surface of the semiconductor substrate 2.

Comparison between a curve α with one shot of the laser beam 32 and a curve β with 100 shots reveals that the profile of the concentration of the doped impurity element and the depth from the upper surface of the semiconductor substrate 2 depends on the number of shots. This reveals that the semiconductor device manufactured using the impurity-doping apparatus 1 according to the embodiment of the present invention is suitable for the case of high-concentration doping near the upper surface of the semiconductor substrate 2.

Using the impurity-doping apparatus 1 according to the embodiment of the present invention, as illustrated in FIG. 17, the laser beam 32 is irradiated through the solution 4 containing the impurity element of the second conductivity type (p-type) onto a part of the semiconductor substrate 2 of the first conductivity (n-type) to manufacture a semiconductor device with a p-type impurity region 2z formed. Between the n-type semiconductor substrate 2 and p-type impurity region 2z in the manufactured semiconductor device, a circuit including a cathode ohmic electrode C, an ammeter A, and a DC power supply connected in series is configured. Voltage is then applied across the n layer of the semiconductor device and p-type impurity region 2z.

The manufactured semiconductor device illustrates forward rectifying characteristics as illustrated in FIG. 18, and it is confirmed that a pn junction is formed between the n layer of the semiconductor device and the p-type impurity region 2z. In other words, the p-type impurity region 2z effectively functions as an anode region of a diode as intended at manufacturing the semiconductor device. By forming a p-type source region and p-type drain region in the n-type semiconductor substrate 2, a field effect transistor can be also implemented. The p-type and n-type may be reversed.

Next, a description is given of wall-like blocks of impurity-doping apparatus according to other embodiments of the present invention. The impurity-doping apparatus according to each embodiment of the present invention described below is different from the embodiment of the present invention that the circulation system includes a wall-like block different from the wall-like block 10 of the embodiment of the present invention. Each impurity-doping apparatus according to other embodiments of the present invention is different from that of the embodiment of the present invention especially in the configurations of feeding and ejecting canals of the wall-like block. The configurations of the injection and evacuating tubes, pumps, valves, and tanks connected to the feeding and ejecting canals are the same as those of the circulation system according to the embodiment of the present invention. The differences between the wall-like blocks according to other embodiments of the present invention and the wall-like block 10 according to the embodiment of the present invention are described with reference to FIGS. 19 to 23, and the same configurations are not described.

Figure 19:
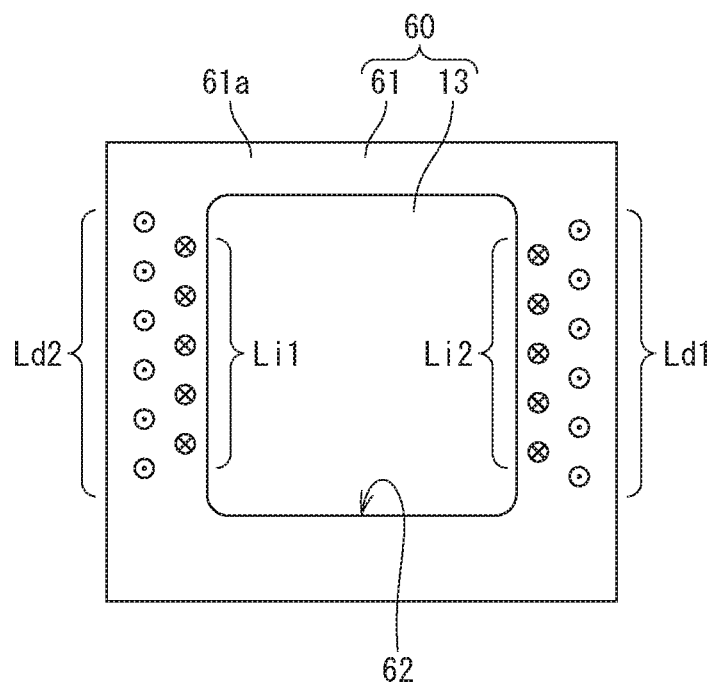
FIG. 19 is a top view for explaining a wall-like block included in the impurity-doping apparatus according to other embodiment of the present invention.

As illustrated in FIG. 19, a wall-like block 60 according to another embodiment of the present invention includes: a rectangular-shaped body box 61 and a transmission window 13. The body box 61 includes a recess 62 penetrating inside. The transmission window 13 is horizontally laid within the body box 61 so as to cover the recess 62.

At an area near the recess 62 in the left side of the rectangle illustrated in FIG. 19, which correspond to one of two sides opposite to each other in the right-left direction, among four sides of the rectangle implemented by the upper surface 61a of the body box 61, five feeding canals for injecting solution are provided along the recess 62 of the body box 61. The openings of the five feeding canals implement a first feeding canal opening line Li1. The openings of the five feeding canals of the first feeding canal opening line Li1 are aligned in a straight line along the one side at regular intervals in the upper surface 61a of the body box 61.

On the one side of the body box 61, six ejecting canals for discharging the solution are provided outside of the first feeding canal opening line Li1. The openings of the six ejecting canals implement a second ejecting canal opening line Ld2. The openings of the six ejecting canals of the second ejecting canal opening line Ld2 are aligned at regular intervals in a straight line along the one side in parallel to the first feeding canal opening line Li1.

At an area near the recess 62 in the right side of the rectangle illustrated in FIG. 19, which correspond to the other side in the right-left direction, in the upper surface 61a of the body box 61, five feeding canals for injecting the solution are provided along the recess 62 of the body box 61. The openings of the five feeding canals implement a second feeding canal opening line Li2. The openings of the five feeding canals of the second feeding canal opening line Li2 are aligned in a straight line along the other side at regular intervals.

On the other side of the body box 61, six ejecting canals for discharging the solution are provided outside of the second feeding canal opening line Li2. The openings of the six ejecting canals implement a first ejecting canal opening line Ld1. The openings of the six ejecting canals of the first ejecting canal opening line Ld1 are aligned in a straight line along the other side in parallel to the second feeding canal opening line Li2 at regular intervals in the upper surface 61a of the body box 61.

In the wall-like block 60 illustrated in FIG. 19, the first feeding and ejecting canal opening lines Li1 and Ld1 form one flow path of the solution. The second feeding and ejecting canal opening lines Li2 and Ld2 form another flow path of the solution in the direction opposite to that of the one flow path.

In the wall-like block 10 illustrated in FIG. 3, the two ejecting canals 16 and 18 on the other side of the rectangle are provided at the center of the side in the inside-outside direction or in the direction of the X axis. In the wall-like block 60 illustrated in FIG. 19, the first and second ejecting canal opening lines Ld1 and Ld2 are disposed outside of the centers of the respective sides in the inside-outside direction. In the movement of the supporting plate from the one side of the rectangle to the other side, which is illustrated as left to right in FIG. 19, at the other side in the lower surface of the body box 61, the region in which the solution moves before being discharged from the first ejecting canal opening line Ld1 is larger than that in the case of the wall-like block 10 illustrated in FIG. 3. This can prevent the solution in the internal space of the wall-like block 60 from leaking out of the wall-like block 60 when moving from the one side of the rectangle to the other side in the direction of the X axis of the supporting plate.

In movement of the supporting plate from the other side of the rectangle to the one side, which is illustrated as right to left in FIG. 19, the region in which the solution moves before being discharged from the second ejecting canal opening line Ld2 is larger than that in the case of the wall-like block 10 illustrated in FIG. 3. This can prevent the solution in the internal space of the wall-like block 60 from leaking out of the wall-like block 60 when moving from the other side of the rectangle to the one side in the direction of the X axis of the supporting plate.

Figure 20:
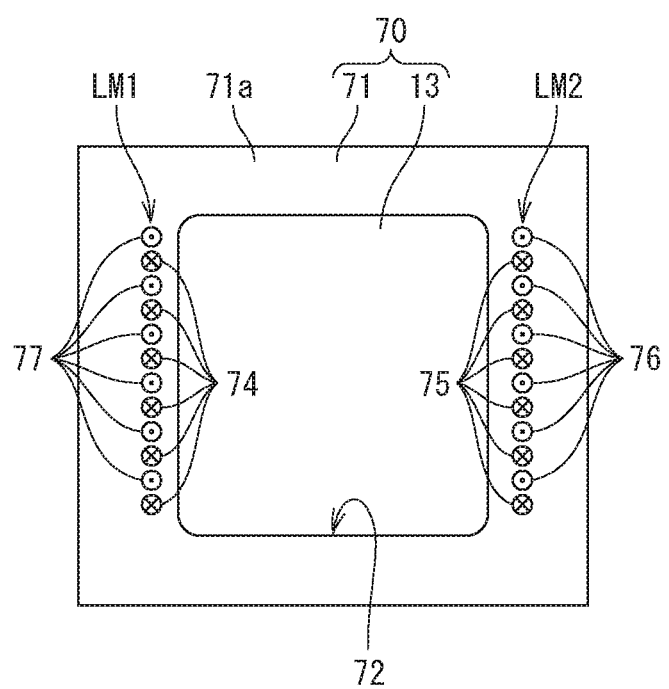
FIG. 20 is a top view for explaining a wall-like block included in the impurity-doping apparatus according to still other embodiment of the present invention.

Next, as illustrated in FIG. 20, a wall-like block 70 according to still another embodiment of the present invention includes a rectangular-shaped body box 71 and a transmission window 13. The body box 71 includes a recess 72 penetrating inside. The transmission window 13 is horizontally laid within the body box 71 so as to cover the recess 72.

At an area near the recess 72 in the left side of the rectangle illustrated in FIG. 20, which correspond to one of two sides opposite to each other in the right-left direction, in the upper surface 71a of the body box 71, six feeding canals 74 and six ejecting canals 77 are provided along the recess 72 of the body box 71. The openings of the six feeding canals 74 and six ejecting canals 77 implement a first feeding-ejecting mixed opening line LM1. The openings of the six feeding canals 74 and six ejecting canals 77 of the first feeding-ejecting mixed opening line LM1 are alternately aligned on a straight line along the one side at regular intervals in the upper surface 71a of the body box 71.

At an area near the recess 72 in the right side of the rectangle illustrated in FIG. 20, which correspond to the other side, among four sides of the rectangle implemented by the upper surface 71a of the body box 71, six feeding canals 75 and six ejecting canals 76 are provided along the recess 72 of the body box 71. The openings of the six feeding canals 75 and six ejecting canals 76 implement a second feeding-ejecting mixed opening line LM2. The openings of the six feeding canals 75 and six ejecting canals 76 of the second feeding-ejecting mixed opening line LM2 are alternately aligned in a straight line along the other side at regular intervals in the upper surface 71a of the body box 71.

In the wall-like block 70 illustrated in FIG. 20, the six feeding canals 74 constituting the first feeding-ejecting mixed opening line LM1 and the six ejecting canals 76 constituting the second feeding-ejecting mixed opening line LM2 form one flow path of the solution. The six feeding canals 75 constituting the second feeding-ejecting mixed opening line LM2 and the six ejecting canals 77 constituting the first feeding-ejecting mixed opening line LM1 form another flow path of the solution in the direction opposite to the one flow path. The first and second feeding-ejecting mixed opening lines LM1 and LM2 are symmetric to each other with respect to the recess 72.

Figure 21:
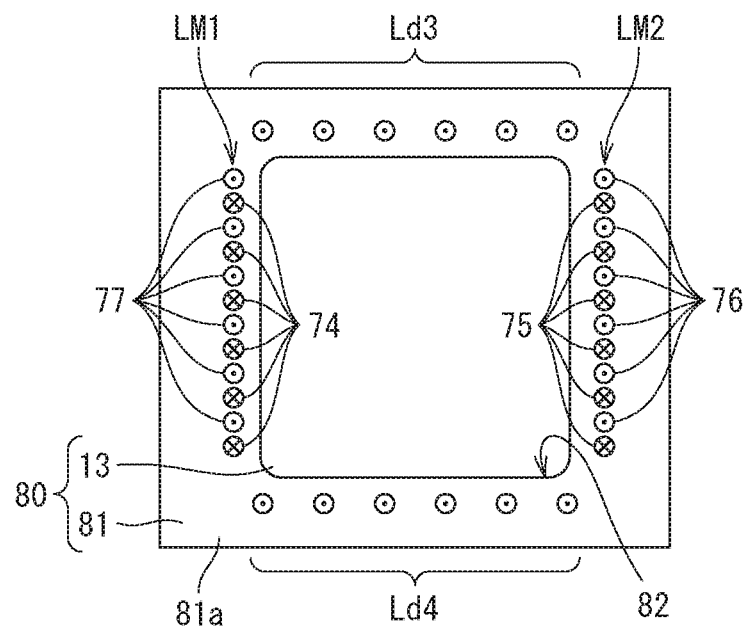
FIG. 21 is a top view for explaining a wall-like block included in the impurity-doping apparatus according to still other embodiment of the present invention.

Next, as illustrated in FIG. 21, a wall-like block 80 according to still another embodiment of the present invention includes a rectangular-shaped body box 81 and a transmission window 13. The body box 81 includes a recess 82 penetrating inside. The transmission window 13 is horizontally laid within the body box 81 so as to cover the recess 82.

At an area near the recess 82 in the left side of the rectangle illustrated in FIG. 21, which correspond to one of two sides opposite to each other in the right-left direction, among four sides of the rectangle implemented by the upper surface 81a of the body box 81, a first feeding-ejecting mixed opening line LM1, which is implemented by six feeding canals 74 and six ejecting canals 77, is formed. The first feeding-ejecting mixed opening line LM1 has the same configuration as the first feeding-ejecting mixed opening line LM1 in the wall-like block 70 illustrated in FIG. 20. At an area near the recess 82 in the right side of the rectangle illustrated in FIG. 21, which correspond to the other side, in the upper surface 81a of the body box 81, a second feeding-ejecting mixed opening line LM2, which is implemented by six feeding canals 75 and six ejecting canals 76, is formed. The second feeding-ejecting mixed opening line LM2 has the same configuration as the second feeding-ejecting mixed opening line LM2 in the wall-like block 70 illustrated in FIG. 20.

In the wall-like block 80, at the upper side of the rectangle illustrated in FIG. 21, which correspond to one of two sides opposite to each other in the top-bottom direction, among four sides of the rectangle implemented by the body box 81, six ejecting canals for discharging the solution are provided along the recess 82 of the body box 81. The openings of the six ejecting canals implement a third ejecting canal opening line Ld3. The openings of the six ejecting canals of the third ejecting canal opening line Ld3 are aligned at regular intervals in a straight line along the upper side of the rectangle in the upper surface 81a of the body box 81.

At the lower side of the rectangle illustrated in FIG. 21, which correspond to the other side of the two sides opposite to each other in the top-bottom direction of the body box 81, six ejecting canals for discharging the solution are provided along the recess 82 of the body box 81. The openings of the six ejecting canals implement a fourth ejecting canal opening line Ld4. The openings of the six ejecting canals of the fourth ejecting canal opening line Ld4 are aligned in a straight line along the lower side of the rectangle at regular intervals in the upper surface 81a of the body box 81. The third and fourth ejecting canal opening lines Ld3 and Ld4 are symmetric to each other with respect to the recess 82.

In the wall-like block 80 illustrated in FIG. 21, the six feeding canals 74 constituting the first feeding-ejecting mixed opening line LM1 correspond to the six ejecting canals 76 constituting the second feeding-ejecting mixed opening line LM2, the six ejecting canals constituting the third ejecting canal opening line Ld3, and the six ejecting canals constituting the fourth ejecting canal opening line Ld4. In other words, one flow path is formed in which the solution injected on the left side of the rectangle of the body box 81 is evacuated from the three sides of the right, upper, and lower sides of the rectangle.

The six feeding canals 75 constituting the first feeding-ejecting mixed opening line LM2 correspond to the six ejecting canals 77 constituting the first feeding-ejecting mixed opening line LM1, the six ejecting canals constituting the third ejecting canal opening line Ld3, and the six ejecting canals constituting the fourth ejecting canal opening line Ld4. In other words, another flow path is formed in which the solution injected on the right side of the rectangle of the body box 81 is evacuated from the three sides of the left, upper, and lower sides of the rectangle.

In the wall-like block 80, plural ejecting canals constituting the four opening lines LM1, LM2, Ld3, and Ld4 are arranged in the upper, lower, right, and left sides in the periphery of the rectangle of the body box 81. The wall-like block 80 is accordingly provided for the impurity-doping apparatus so that the right-left direction of the rectangle matches the direction of the X axis of the supporting plate and the up-down direction of the rectangle matches the direction of the Y axis of the supporting plate, for example. In addition to the effect by the wall-like block 10 illustrated in FIG. 3, the solution can be more reliably prevented from leaking out when the supporting plate moves along any one of the X and Y axes.

Figure 22:
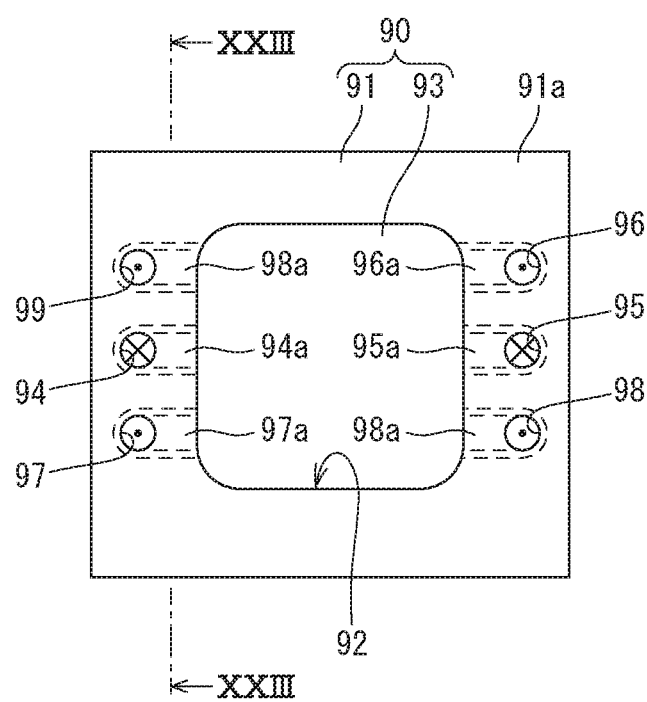
FIG. 22 is a top view for explaining a wall-like block included in the impurity-doping apparatus according to still other embodiment of the present invention.

Next, as illustrated in FIG. 22, a wall-like block 90 according to still another embodiment of the present invention includes a rectangular-shaped body box 91 and a transmission window 13. The body box 91 includes a recess 92 penetrating inside. The transmission window 13 is horizontally laid within the body box 91 so as to cover the recess 92.

At an area near the recess 92 in the left side of the rectangle illustrated in FIG. 22, which correspond to one of two sides opposite to each other in the right-left direction, among four sides of the rectangle implemented by the upper surface 91a of the body box 91, one feeding canal 94 and two ejecting canals 97 and 99 are formed. The feeding canal 94 and two ejecting canals 97 and 99 are aligned and opened at regular intervals in a straight line along the one side so that the feeding canal 94 is sandwiched between the ejecting canals 97 and 99.

At an area near the recess 92 in the right side of the rectangle illustrated in FIG. 22, which correspond to the other side, in the upper surface 91a of the body box 91, one feeding canal 95 and two ejecting canals 96 and 98 are formed. The feeding canal 95 and two ejecting canals 96 and 98 are aligned and opened at regular intervals in a straight line along the other side so that the feeding canal 95 is sandwiched between the ejecting canals 96 and 98.

The one feeding canal 94 on the one side of the body box 91 and the two ejecting canals 96 and 98 on the other side implement one flow path of the solution. The one feeding canal 95 on the other side of the body box 91 and the two ejecting canals 97 and 99 on the one side implement another flow path of the solution in the direction opposite to the one flow path.

Each of the feeding canal 94 and two ejecting canal 97 and 99 penetrates the body box 91 from the upper surface 91a to the lower surface. The feeding canal 94 and two ejecting canal 97 and 99 are independently provided with grooves 94a, 97a, and 99a, respectively, which connect bottom portions of the respective holes to the internal space of the body box 91. Each of the three grooves 94a, 97a, and 99a has an isosceles trapezoidal shape with the lower base longer than the upper base in the cross-sectional view of the body box 91 as illustrated in FIG. 23.

Each of the feeding canal 95 and two ejecting canals 96 and 98 vertically penetrates the body box 91 from the upper surface 91a to the lower surface. The feeding canal 95 and two ejecting canals 96 and 98 are independently provided with grooves 95a, 96a, and 98a, respectively, which connect bottom portions of the respective holes to the internal space of the body box 91. Each of the three grooves 95a, 96a, and 98a has an isosceles trapezoidal shape with the lower base longer than the upper base in the cross-sectional view of the body box 91 in a similar manner to the three grooves 94a, 97a, and 99a on the one side of the body box 91.

The feeding canal 94 and two ejecting canals 97 and 99 on the one side of the body box 91 and the feeding canal 95 and two ejecting canals 96 and 98 on the other side are symmetric to each other with respect to the recess 92.

Figure 23:
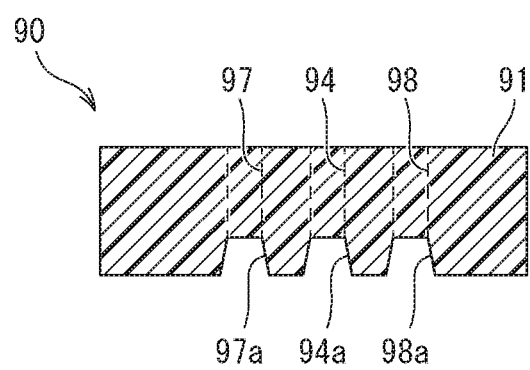
FIG. 23 is a cross-sectional view along a line XXIII-XXIII in FIG. 22.

According to the wall-like block 90 illustrated in FIGS. 22 and 23, the plural feeding canals 94 and 95 and plural ejecting canals 96 to 99 are provided with the independent grooves that connect the respective holes to the internal space of the body box 91. This allows the solution to more smoothly flow in the internal space, implementing efficient circulation.

By using the impurity-doping apparatus 1 according to the embodiments of the present invention described above, the following effects can be obtained.

With the impurity-doping apparatus 1 according to the embodiments of the present invention, the localized solution region, where the solution 4 containing the impurity elements are localized, is formed on the upper surface of the semiconductor substrate 2 by the wall-like block 10. The upper surface of the semiconductor substrate 2 comes into contact only with the solution 4 surrounded by the wall-like block 10 and is not immersed in the solution 4 entirely. This can reduce the amount of the solution 4 required in laser doping compared with the case where the semiconductor substrate 2 is entirely immersed in the solution 4. Moreover, the circulated amount of the solution 4 can be reduced, and the pumps 42 and 53 used in the circulation system 40 can be miniaturized, so that the circulation system 40 can be more compact.

With the impurity-doping apparatus 1 according to the embodiment of the present invention, it is unnecessary to immerse the entire semiconductor substrate 2 in the solution 4. Accordingly, portions unnecessary to be subjected to laser doping, including the back surface of the semiconductor substrate 2, for example, are prevented from being contaminated due to exposure to the solution 4. It is accordingly possible to omit the processes to form and remove protection film that prevents contamination of the portions unnecessary to be subjected to laser doping. Moreover, it is possible to eliminate the limitation of the materials of the semiconductor substrate 2 to materials resistant to contamination by the solution 4 and increases the flexibility in selecting the materials.

With the impurity-doping apparatus 1 according to the embodiment of the present invention, the solution 4 supplied to the internal space V in the wall-like block 10 is collected and circulated using the feeding and ejecting canals formed in the wall-like block 10. The portion of the solution 4 in the internal space V in the wall-like block 10 is properly discharged, and a portion of the solution 4 more fresh than the discharged portion is steadily supplied to the upper surface of the semiconductor substrate 2. Even at continuous irradiation of the laser beam 32, it is possible to reduce variations in doping due to variations in concentration or deterioration of the solution 4 supplied to the upper surface of the semiconductor substrate 2, thus implementing stable laser doping.

With the impurity-doping apparatus 1 according to the embodiment of the present invention, the height h of the gap G formed between the wall-like block 10 and the upper surface of the semiconductor substrate 2 is configured so that the solution 4 is prevented by surface tension from leaking out. This can implement laser doping with the wall-like block 10 kept separated from the upper surface of the semiconductor substrate 2 without leaking the solution 4 out of the wall-like block 10. It is accordingly possible to prevent the wall-like block 10 from coming into contact with the semiconductor substrate 2 and damaging the surface of the semiconductor substrate 2 while the semiconductor substrate 2 moves with movement of the supporting plate 3. Moreover, since the wall-like block 10 is not in contact with the upper surface of the semiconductor substrate 2, the semiconductor substrate 2 moves smoothly.

With the impurity-doping apparatus 1 according to the embodiment of the present invention, the lower surface 11b of the body box 11 of the wall-like block 10 includes a water-repellent portion, and the water-repellent portion exerts the force to hold the solution 4 inside. The solution 4 in the internal space V in the wall-like block 10 is accordingly efficiently prevented from leaking out of the wall-like block 10.

Hereinabove, the impurity-doping apparatus and the semiconductor device manufacturing method according to the embodiments of the present invention are described. However, the present invention is not limited to the aforementioned embodiments. For example, the impurity-doping apparatus may be configured to irradiate the laser beam 32 to the localized solution region while bringing the solution containing the impurity element into contact with the lower surface of the semiconductor substrate 2. In the present invention, it is necessary to selectively form a region where the solution containing impurity elements is localized, on the surface of a sample such as a semiconductor substrate, and the configurations of the aforementioned embodiments may be properly changed or combined.

What is claimed is:

1. A method for doping impurities, comprising:
disposing a wall-like block, having a recess, above a semiconductor substrate, so that the wall-like block is suspended above the semiconductor substrate and the recess is facing the semiconductor substrate so as to form a space between the wall-like block and the semiconductor substrate, the wall-like block including
a first feeding canal connected to the recess and located on a first side of the wall-like block,
a second feeding canal connected to the recess and located on a second side of the wall-like block opposite to the first side,
a first ejecting canal located on the second side, the first ejecting canal extending vertically from an upper surface to a lower surface of the wall-like block, and
a second ejecting canal located on the first side, the second ejecting canal extending vertically from the upper surface to the lower surface of the wall-like block;
forming a solution region where a layer of solution containing impurity elements is localized, inside the space, on a surface of a portion of the semiconductor substrate defined by the recess so that the impurity elements are selectively in contact with the semiconductor substrate, the space between the wall-like block and the semiconductor substrate being selected such that the surface tension does not allow the solution to leak beyond the wall-like block;
moving the solution on the surface of the semiconductor substrate, the moving the solution including
flowing the solution out of the first feeding canal and collecting the solution into the first ejecting canal while maintaining the flow of the solution between the first feeding canal and the first ejecting canal, while the semiconductor substrate is being moved in a first direction and a valve controlling flow of the solution out of the second feeding canal is closed, and
flowing the solution out of the second feeding canal and collecting the solution into the second ejecting canal while maintaining the flow of the solution between the second feeding canal and the second ejecting canal, while the semiconductor substrate is being moved in a second direction and a valve controlling flow of the solution out of the first feeding canal is closed; and
irradiating a laser beam to the surface of the semiconductor substrate through the solution region so that the impurity elements are doped into a part of the semiconductor substrate.

2. The method of claim 1,
wherein in the irradiating the laser beam, the laser beam is irradiated in a direction intersecting with the moving direction of the solution.

3. The method of claim 2, further comprises:
moving the semiconductor substrate in X and Y directions, which are defined in a plane parallel to the surface of the semiconductor substrate,
wherein a pattern in which the impurity elements are doped into a part of the semiconductor substrate is directly delineated.

4. The method of claim 3,
wherein in the irradiating the laser beam, the semiconductor substrate is moved in the same direction as the moving direction of the solution.

5. The method of claim 1,
wherein in the moving the localized solution, a bottom surface of the wall-like block has a water-repellent portion so as to prevent the localized solution from leaking out of the space.

6. The method of claim 1, wherein the moving the solution further includes collecting the solution in the recess of the wall-like block by the first ejecting canal and the second ejecting canal when the moving direction of the semiconductor substrate is switched between the first direction and the second direction.

7. A method of manufacturing a semiconductor device, comprising:
disposing a wall-like block, having a recess, above a semiconductor substrate of a first or second conductivity type so that the wall-like block is suspended above the semiconductor substrate and the recess is facing the semiconductor substrate so as to form a space between the wall-like block and the semiconductor substrate, the wall-like block including
a first feeding canal connected to the recess and located on a first side of the wall-like block,
a second feeding canal connected to the recess and located on a second side of the wall-like block opposite to the first side,
a first ejecting canal located on the second side, the first ejecting canal extending vertically from an upper surface to a lower surface of the wall-like block, and
a second ejecting canal located on the first side, the second ejecting canal extending vertically from the upper surface to the lower surface of the wall-like block;
forming a solution region where a layer of solution containing impurity elements of a first conductivity type is localized, inside the space, on a part of a surface of the semiconductor substrate defined by the recess so that the impurity elements are selectively in contact with the semiconductor substrate, the space between the wall-like block and the semiconductor substrate being selected such that the surface tension inhibits the solution from leaking beyond the wall-like block;
moving the solution on the surface of the semiconductor substrate, the moving the solution including
flowing the solution out of the first feeding canal and collecting the solution into the first ejecting canal while maintaining the flow of the solution between the first feeding canal and the first ejecting canal, while the semiconductor substrate is being moved in a first direction and a valve controlling flow of the solution out of the second feeding canal is closed, and
flowing the solution out of the second feeding canal and collecting the solution into the second ejecting canal while maintaining the flow of the solution between the second feeding canal and the second ejecting canal, while the semiconductor substrate is being moved in a second direction and a valve controlling flow of the solution out of the first feeding canal is closed; and
irradiating a laser beam onto the semiconductor substrate through the solution region to form a first semiconductor region of the first conductivity type in the surface of the semiconductor substrate.

8. The method of claim 7,
wherein in the irradiating, to form the first semiconductor region, the laser beam is irradiated in the direction intersecting with the moving direction of the solution.

9. The method of claim 8,
wherein in the irradiating, to form the first semiconductor region, the semiconductor substrate is moved in the same direction as the moving direction of the solution.

10. The method of claim 9,
wherein at the surface of the semiconductor substrate, a second semiconductor region of the first conductivity type is formed beforehand, and
the first semiconductor region is formed in the second semiconductor region so that the first semiconductor region is doped at higher concentration than that of the second semiconductor region.

11. The method of claim 10, further comprises:
forming an ohmic electrode layer in the first semiconductor region.

12. The method of claim 7,
wherein in the moving the localized solution, a bottom surface of the wall-like block has a water-repellent portion so as to prevent the localized solution from leaking out of the space.

13. The method of claim 7, wherein the moving the solution further includes collecting the solution in the recess of the wall-like block by the first ejecting canal and the second ejecting canal when the moving direction of the semiconductor substrate is switched between the first direction and the second direction.

* * * * *